(12) United States Patent
Kondo et al.

(10) Patent No.: US 7,605,841 B2
(45) Date of Patent: Oct. 20, 2009

(54) INFORMATION PROCESSING SYSTEM AND METHOD, INFORMATION PROCESSING APPARATUS, IMAGE-CAPTURING DEVICE AND METHOD, RECORDING MEDIUM, AND PROGRAM

(75) Inventors: Tetsujiro Kondo, Tokyo (JP); Naoki Kobayashi, Tokyo (JP); Yasuhiro Fujimori, Kanagawa (JP); Yasuaki Takahashi, Kanagawa (JP); Koji Ohta, Kanagawa (JP); Naoki Takeda, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/847,642

(22) Filed: Aug. 30, 2007

(65) Prior Publication Data

US 2008/0002027 A1   Jan. 3, 2008

Related U.S. Application Data

(62) Division of application No. 10/681,242, filed on Oct. 9, 2003.

(30) Foreign Application Priority Data

Oct. 18, 2002 (JP) .............................. 2002-303795
Jan. 14, 2003 (JP) .............................. 2003-005316
Jan. 22, 2003 (JP) .............................. 2003-013686

(51) Int. Cl.
*H04N 7/18* (2006.01)

(52) U.S. Cl. ....................................... 348/143; 348/148

(58) Field of Classification Search ................. 348/143, 348/148; 340/461; 370/445; 280/735; 455/115.1
See application file for complete search history.

(56) References Cited

U.S. PATENT DOCUMENTS 5,251,211 A * 10/1993 Mutoh et al. ................. 370/445
5,871,232 A *  2/1999 White ......................... 280/735
5,956,626 A *  9/1999 Kaschke et al. ........... 455/115.1

(Continued)

FOREIGN PATENT DOCUMENTS

JP                56-85368           6/1981

(Continued)

*Primary Examiner*—Allen Wong
(74) *Attorney, Agent, or Firm*—Oblon, Spivak, McClelland, Maier & Neustadt, L.L.P.

(57) ABSTRACT

A feature extracting unit obtains sensor data from a plurality of sensors to calculate each feature. When an event determining unit determines the occurrence of an event based on each feature, a display data constructor generates remote-controller display data for displaying the event, and controls a remote-controller display device to display the remote-controller display data. When a user decision is input from a user input IF based on this display, a control unit controls the sensors to be turned ON or OFF. When an infrared sensor detects an abnormality, a microwave sensor whose power consumption is small after the infrared sensor is turned ON. When the microwave sensor detects an abnormality, a video camera and a microphone are turned ON, and the microwave sensor is turned OFF. A communication unit wirelessly transmits an image signal captured by the video camera and an audio signal processed by the microphone. Then, if the infrared sensor does not detect an abnormality, the video camera and the microphone are turned OFF. With this arrangement, power consumption can be suppressed. The present invention is applied to, for example, a security system, for example, for monitoring outside a vehicle by a video camera disposed in the vehicle when the vehicle is parked.

20 Claims, 33 Drawing Sheets

U.S. PATENT DOCUMENTS

| | | | |
|---|---|---|---|
| 6,025,872 | A | 2/2000 | Ozaki et al. |
| 6,304,173 | B2 * | 10/2001 | Pala et al. .................. 340/461 |
| 6,731,332 | B1 | 5/2004 | Yasui et al. |
| 7,102,503 | B2 | 9/2006 | Kondo et al. |
| 2005/0073580 | A1 | 4/2005 | Takeda et al. |

FOREIGN PATENT DOCUMENTS

| | | |
|---|---|---|
| JP | 01-106997 | 7/1989 |
| JP | 5-238314 | 9/1993 |
| JP | 6-110548 | 4/1994 |
| JP | 8-265611 | 10/1996 |
| JP | 11-33975 | 2/1999 |
| JP | 11-304502 | 11/1999 |
| JP | 2000-128031 | 5/2000 |
| JP | 2000-199925 | 7/2000 |
| JP | 2001-014561 | 1/2001 |
| JP | 2002-29349 | 1/2002 |
| JP | 2002-245571 | 8/2002 |
| JP | 2002-352340 | 12/2002 |

* cited by examiner

INFORMATION PROCESSING SYSTEM AND METHOD, INFORMATION PROCESSING APPARATUS, IMAGE-CAPTURING DEVICE AND METHOD, RECORDING MEDIUM, AND PROGRAM

CROSS-REFERENCE TO RELATED APPLICATIONS

The present application is a divisional of application Ser. No. 10/681,242, filed on Oct. 9, 2003, which claims priority to Japanese Patent Application Nos. 2002-303795, filed Oct. 18, 2002, 2003-005316, filed Jan. 14, 2003, and 2003-013686, filed Jan. 22, 2003, the entire contents of each of which are incorporated herein by reference.

BACKGROUND OF THE INVENTION

1. Field of the Invention

The present invention relates to information processing systems and methods, information processing apparatuses, recording media, and programs. More particularly, the invention relates to an information processing system and method, an information processing apparatus, a recording medium, and a program in which events can be flexibly detected and reported so as to inhibit power consumption. The invention also pertains to an image-capturing device and method, a recording medium, and a program in which the situation outside a vehicle can be monitored by a back monitor camera disposed in the vehicle while the vehicle is being parked.

2. Description of the Related Art

Hitherto, in home security systems, a method for obtaining sensor information by viewing a monitor television (TV) that displays monitor images sent from an image-capturing device has been suggested (for example, Japanese Unexamined Patent Application Publication No. 08-124078).

Another method for detecting humans entering a monitored area by determining the presence or absence of human bodies or traces by using a monitor device formed as a combination of an infrared sensor and an image sensor has been suggested (for example, Japanese Unexamined Patent Application Publication No. 2000-339554).

In the inventions disclosed in the above publications, principally, specific places or specific abnormalities (events) are detected.

In the inventions disclosed in the above publications, however, adjustments required for installing the sensors (the image-capturing device and the monitor device) are troublesome, and once they are installed, it is difficult to move them to another place.

If power is supplied to a security camera by a cable from indoors, the installation place of the security camera is also restricted. Accordingly, power is supplied to the individual elements of the security camera from batteries, thereby increasing the flexibility to install the camera.

In this case, however, the life of the batteries is short, and when the batteries have run out, the security camera can no longer capture images. A user is thus required to regularly charge or replace the batteries, which is troublesome, and the user sometimes does not realize that the batteries have run out.

In ordinary households, the installation of security cameras is becoming popular. In this case, security cameras are generally installed outdoors, and images from security cameras are sent to monitors disposed indoors by wireless means. This allows users to monitor the situation outdoors through security cameras while remaining indoors.

Images captured by such security cameras are constantly recorded on recording media, for example, video cassette tape.

Accordingly, the amount of image data recorded from the security cameras becomes very large, and the communication cost for sending the image data is high. Additionally, the user has to search through a large amount of image data sent from the security camera, which is very time-consuming.

Thus, a method for capturing image data only when someone intrudes into a monitored area so as to decrease the amount of image data to be stored in a storage medium has been suggested (for example, see Japanese Unexamined Patent Application Publication No. 2000-132774). In this method, the communication cost can be reduced and search in playing back image data can be facilitated.

In the method disclosed in this publication, however, when someone intrudes into the monitored area, the camera is operated to capture image data and the image data is stored in a storage device. Accordingly, it cannot be determined whether an intruder approaches the monitored area or goes away from the monitored area, thereby storing unnecessary images. Additionally, the standard for detecting an intrusion never changes, and events (detection of an intrusion) of no interest to the users may sometimes be stored and reported.

SUMMARY OF THE INVENTION

Accordingly, in view of this background, it is an object of the present invention to flexibly detect and report events so as to inhibit power consumption, and also to decrease the amount of images stored in case of the occurrence of abnormalities.

It is another object of the present invention to more precisely detect abnormalities requested by users without increasing the power consumption.

It is still another object of the present invention to monitor outside a vehicle by a camera disposed in the vehicle while the vehicle is being parked, without increasing the power consumption.

In order to achieve the above object, an information processing system of the present invention includes: a sensor unit for obtaining sensor data; a feature extracting unit for extracting a feature of an object based on sensor data obtained by the sensor unit; an event determining unit for obtaining the feature extracted by the feature extracting unit so as to determine whether an event has occurred based on determination parameters; a display-data generator for generating, when the occurrence of the event is determined by the event determining unit, display data including event data for reporting the occurrence of the event; a display device for giving an indication based on the display data generated by the display-data generator; an input reception unit for receiving the input of a user decision based on the indication given by the display device; and a control unit for performing control processing based on the input of the user decision received by the input reception unit.

The above-described display-data generator may further generate remote-controller display data consisting of the event data for reporting the occurrence of the event to a remote controller for controlling the display-data generator.

The aforementioned information processing system may further include a remote-controller display device for displaying the remote-controller display data generated by the display-data generator.

The control unit may include: a parameter controller for updating the determination parameters for determining whether the event has occurred by the event determining unit;

a feature-extracting controller for controlling the feature extracting unit to extract the feature; and a sensor controller for controlling the sensor unit to obtain the sensor data.

The sensor unit may include a plurality of sensors, and the sensor controller may control power sources of the plurality of sensors to be turned ON or OFF.

The display-data generator may generate data based on a predetermined signal as the display data when the event determining unit determines that an event has not occurred.

The sensor unit, the feature extracting unit, the event determining unit, and the control unit may be formed of a first information processing apparatus. The display-data generator may be formed of a second information processing apparatus. The display device may be formed of a third information processing apparatus. The input reception unit may be formed of a fourth information processing apparatus.

Communication between the first information processing apparatus and the second information processing apparatus may be performed wirelessly.

The first information processing apparatus may be driven by a battery.

The sensor unit, the feature extracting unit, the event determining unit, and the control unit may be formed of a first information processing apparatus. The display-data generator and the display device may be formed of a second information processing apparatus. The input reception unit may be formed of a third information processing apparatus.

The display-data generator may generate the display data by inserting the event data into a television broadcast signal.

The sensor unit may include at least one of a camera, a microphone, and an infrared sensor.

An information processing method of the present invention includes: a sensor step of obtaining sensor data; a feature extracting step of extracting a feature of an object based on the sensor data obtained in the sensor step; an event determining step of obtaining the feature extracted in the feature extracting step so as to determine whether an event has occurred based on determination parameters; a display-data generating step of generating, when the occurrence of the event is determined in the event determining step, display data including event data for reporting the occurrence of the event; a display step of giving an indication based on the display data generated in the display-data generating step; an input reception step of receiving the input of a user decision based on the indication given in the display step; and a control step of performing control processing based on the input of the user decision received in the input reception step.

A program recorded in a recording medium of the present invention includes: a feature extracting step of extracting a feature of an object based on sensor data; an event determining step of obtaining the feature extracted in the feature extracting step so as to determine whether an event has occurred based on determination parameters; a display-data generating step of generating, when the occurrence of the event is determined in the event determining step, display data including event data for reporting the occurrence of the event; an input reception step of receiving the input of a user decision; and a control step of performing control processing based on the input of the user decision received in the input reception step.

A program of the present invention allows a computer to execute: a feature extracting step of extracting a feature of an object based on sensor data; an event determining step of obtaining the feature extracted in the feature extracting step so as to determine whether an event has occurred based on determination parameters; a display-data generating step of generating, when the occurrence of the event is determined in the event determining step, display data including event data for reporting the occurrence of the event; an input reception step of receiving the input of a user decision; and a control step of performing control processing based on the input of the user decision received in the input reception step.

An information processing apparatus of the present invention includes a sensor unit for obtaining a plurality of items of sensor data by using a plurality of sensors. The sensor unit turns ON or OFF the plurality of sensors according to a decision signal based on a user instruction transmitted from a first information processing apparatus.

The above information processing apparatus may further include: a feature extracting unit for extracting a feature of an object based on sensor data obtained by the sensor unit; an event determining unit for obtaining the feature extracted by the feature extracting unit so as to determine whether an event has occurred based on determination parameters; a transmitter for transmitting, when the occurrence of the event is determined by the event determining unit, message data for reporting the occurrence of the event to the first information processing apparatus; a receiver for receiving the decision signal transmitted from the first information processing apparatus; and a control unit for performing control processing based on the decision signal received by the receiver.

The control unit may update the determination parameters for determining whether the event has occurred by the event determining unit, and may control the extraction processing of the feature by the feature extracting unit and may control the obtaining processing of the sensor data by the sensor unit.

Wireless communication may be performed in the transmitter and in the receiver.

The information processing apparatus may be driven by a battery.

The plurality of sensors may include at least one of a camera, a microphone, and an infrared sensor.

Another information processing method of the present invention is an information processing method for an information processing apparatus which includes a sensor unit for obtaining a plurality of items of sensor data by using a plurality of sensors so as to perform monitor processing based on the sensor data. The information processing method may include the step of turning ON or OFF the plurality of sensors according to a decision signal based on a user instruction transmitted from a first information processing apparatus.

Another information processing apparatus of the present invention includes a display-data generator for generating, in case of the occurrence of an event, display data by inserting event data for reporting the occurrence of the event into data based on a predetermined signal. When an event has not occurred, the display-data generator generates the data based on the predetermined signal as the display data.

The above information processing apparatus may further include a display device for displaying the display data generated by the display-data generator.

The display-data generator may further generate remote-controller display data consisting of the event data for reporting the occurrence of the event to a first information processing apparatus which remote-controls the information processing apparatus.

The above information processing apparatus may further include: an event-message receiver for receiving message data for reporting the occurrence of the event from a second information processing apparatus; a display-data transmitter for transmitting the remote-controller display data to the first information processing apparatus; a decision signal receiver for receiving a decision signal based on the remote-controller display data from the first information processing apparatus;

and a decision signal transmitter for transmitting the decision signal received by the decision signal receiver to the second information processing apparatus. The display-data generator may perform processing based on the message data.

Wireless communication may be performed in the event-message receiver and in the decision signal transmitter.

The above information processing apparatus may further include: a feature extracting unit for extracting a feature of an object based on sensor data; an event determining unit for obtaining the feature extracted by the feature extracting unit so as to determine whether an event has occurred based on determination parameters; a receiver for receiving a decision signal based on the display data from a first information processing apparatus; and a control unit for performing control processing based on the decision signal received by the receiver. The display-data generator may generate the display data based on a determination result of the event determining unit.

The control unit may update the determination parameters for determining whether the event has occurred by the event determining unit, control the extraction processing of the feature by the feature extracting unit, and transmit a signal for controlling the obtaining processing of the sensor data by the first information processing apparatus to the first information processing apparatus.

The control unit may transmit a signal for turning ON or OFF a plurality of sensors provided for the first information processing apparatus.

Still another information processing apparatus of the present invention includes: a receiver for receiving remote-controller display data consisting of event data for reporting the occurrence of an event from a first information processing apparatus; a display unit for displaying the remote-controller display data received by the receiver; an input reception unit for receiving the input of a user decision based on an indication of the display device; and a transmitter for transmitting a decision signal based on the user decision received by the input reception unit to the first information processing apparatus.

Still another information processing method of the present invention includes: a reception step of receiving remote-controller display data consisting of event data for reporting the occurrence of an event from a first information processing apparatus; a display control step of controlling an indication of the remote-controller display data received in the reception step; an input reception step of receiving the input of a user decision based on the indication controlled in the display control step; and a transmission step of transmitting a decision signal based on the user decision received in the input reception step to the first information processing apparatus.

A program recorded in another recording medium of the present invention includes: a reception step of receiving remote-controller display data consisting of event data for reporting the occurrence of an event from an information processing apparatus; an input reception step of receiving the input of a user decision; and a transmission step of transmitting a decision signal based on the user decision received in the input reception step to the information processing apparatus.

A second program of the present invention allows a computer to execute: a reception step of receiving remote-controller display data consisting of event data for reporting the occurrence of an event from an information processing apparatus; an input reception step of receiving the input of a user decision; and a transmission step of transmitting a decision signal based on the user decision received in the input reception step to the information processing apparatus.

A further information processing apparatus of the present invention includes: a first sensor for detecting an object; a second sensor for detecting the object; a battery for supplying power to the first sensor and the second sensor; and a power supply control unit for supplying power to the first sensor without supplying power to the second sensor under normal conditions, and when an abnormality is detected by the first sensor, the power supply control unit supplying power to the second sensor.

Power consumption of the first sensor may be smaller than that of the second sensor.

The first sensor may be an infrared sensor, and the second sensor may be a microwave sensor.

The information processing apparatus may further include a third sensor whose power consumption is larger than the second sensor.

The third sensor may be a video camera or a microphone.

The second sensor may be a sensor for detecting whether the object is approaching or going away from the second sensor.

The power supply control unit does not supply power to the third sensor when the second sensor detects that the object is going away from the second sensor even if the first sensor detects the presence of the object, and the power supply control unit may supply power to the third sensor when the second sensor detects that the object is approaching.

The above information processing apparatus may further include a transmitter for wirelessly transmitting an output of the third sensor.

A further information processing method of the present invention includes the step of controlling power supply so that power is supplied to a first sensor without supplying power to a second sensor under normal conditions, and when an abnormality is detected by the first sensor, power is supplied to the second sensor.

An image-capturing device of the present invention includes: an image-capturing unit installed inside a vehicle at a position to capture an image outside the vehicle through a rear window; a direction setting unit for setting the image-capturing direction of the image-capturing unit in a monitor mode; a determining unit for determining whether the vehicle is in a first usage mode in which the vehicle is reversed or in a second usage mode in which the vehicle is not used; and a direction control unit for controlling the image-capturing direction of the image-capturing unit to be a direction in the back of the vehicle when the vehicle is in the first usage mode, and for controlling the image-capturing direction to be a direction set by the direction setting unit when the vehicle is in the second usage mode.

The image-capturing device may further include: a detector for detecting an object outside the vehicle through a window of the vehicle; and a power supply control unit for prohibiting power supply to the image-capturing unit when an object is not detected by the detector, and for allowing power supply to the image-capturing unit when an object is detected by the detector.

When the detector detects a moving object, the direction control unit may control the image-capturing direction of the image-capturing unit so that the object is traced.

The image-capturing device may further include a battery for supplying power to the image-capturing unit. When the remaining amount of the battery is smaller than a reference value, the power supply control unit may replace the battery with a battery of the vehicle to supply power.

The image-capturing device may further include: a transmitter for transmitting an image captured by the image-capturing unit; and a transmission-destination setting unit for setting a transmission destination of the image captured by the image-capturing unit to a first display device disposed inside the vehicle when the vehicle is in the first usage mode, and for setting the transmission destination to be a second display device disposed outside the vehicle when the vehicle is in the second usage mode.

The determining unit may determine whether the vehicle is in the first mode or in the second mode based on the status of an engine key and the status of a transmission gear of the vehicle.

An image-capturing method of the present invention includes: a direction setting step of setting an image-capturing direction of an image-capturing unit in a monitor mode; a determining step of determining whether a vehicle is in a first usage mode in which the vehicle is reversed or in a second usage mode in which the vehicle is not used; and a direction control step of controlling the image-capturing direction of the image-capturing unit to be a direction in the back of the vehicle when the vehicle is in the first usage mode, and for controlling the image-capturing direction to be a direction set in the direction setting step when the vehicle is in the second usage mode.

A program recorded in still another recording medium of the present invention includes: a direction setting step of setting an image-capturing direction of an image-capturing unit in a monitor mode; a determining step of determining whether a vehicle is in a first usage mode in which the vehicle is reversed or in a second usage mode in which the vehicle is not used; and a direction control step of controlling the image-capturing direction of the image-capturing unit to be a direction in the back of the vehicle when the vehicle is in the first usage mode, and for controlling the image-capturing direction to be a direction set in the direction setting step when the vehicle is in the second usage mode.

Still another program of the present invention includes: a direction setting step of setting an image-capturing direction of an image-capturing unit in a monitor mode; a determining step of determining whether a vehicle is in a first usage mode in which the vehicle is reversed or in a second usage mode in which the vehicle is not used; and a direction control step of controlling the image-capturing direction of the image-capturing unit to be a direction in the back of the vehicle when the vehicle is in the first usage mode, and for controlling the image-capturing direction to be a direction set in the direction setting step when the vehicle is in the second usage mode.

DESCRIPTION OF THE PREFERRED EMBODIMENTS

The present invention is described in detail below with reference to the drawings through illustration of preferred embodiments.

Figure 1:
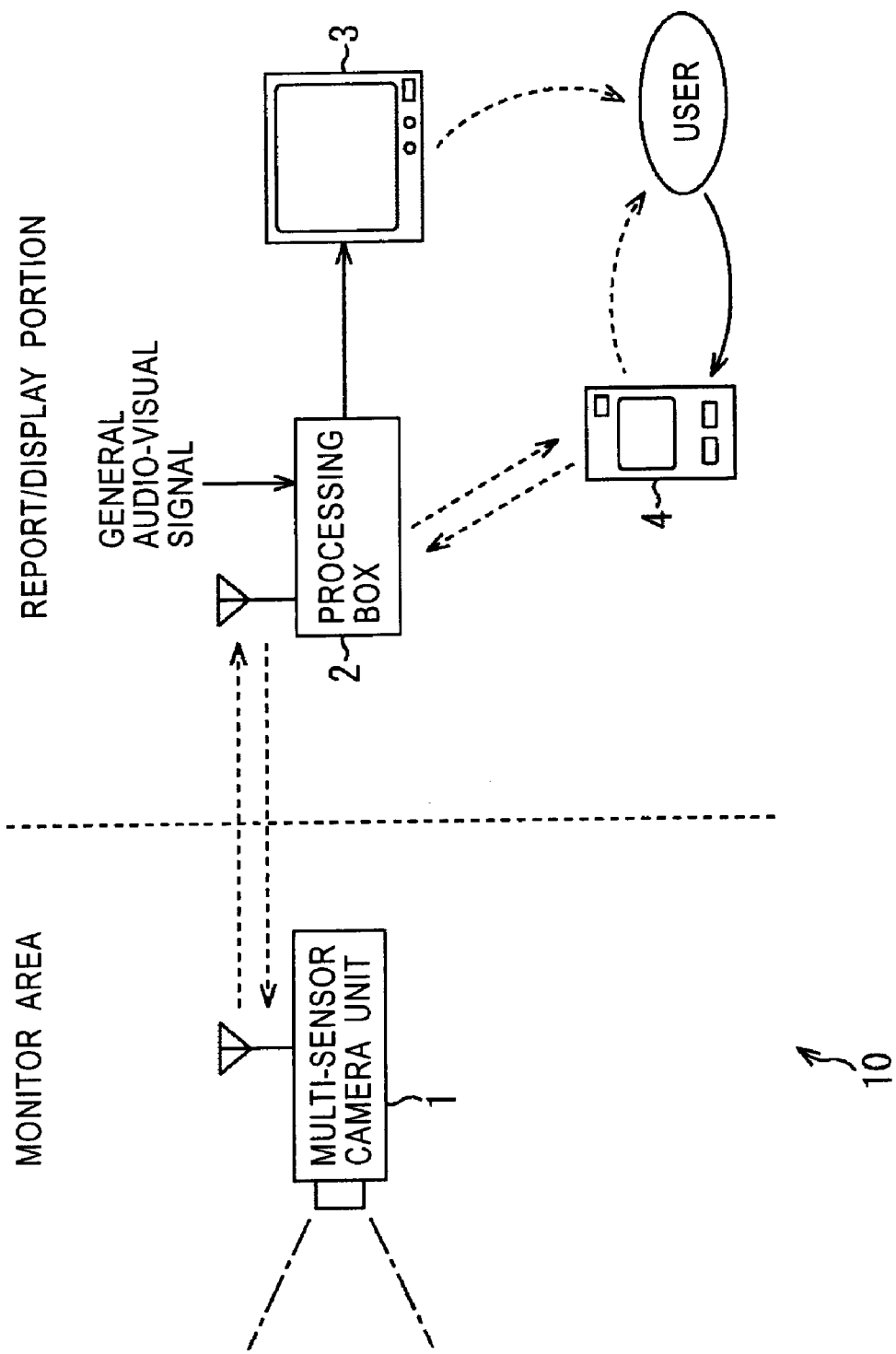
FIG. 1 illustrates the configuration of a monitor system according to an embodiment of the present invention.

FIG. 1 illustrates the configuration of a monitor system 10 according to an embodiment of the present invention. In the monitor system 10, a multi-sensor camera unit 1 is disposed in a monitored area at the left side of FIG. 1, and a processing box 2, a display device 3, and a remote controller 4 for remote-controlling the processing box 2 are provided at a report/display portion at the right side of FIG. 1. Wireless communication is performed between the multi-sensor camera unit 1 and the processing box 2.

A plurality of sensors, driven by batteries, are provided in the multi-sensor camera unit 1. The sensors are installed in an area for monitoring events. When an event occurs, the processing box 2 constructs an image to be displayed, and sound to be output, informs the display device 3 and the remote controller 4 that an event has occurred, and controls the display device 3 and the remote controller 4 to display the image and output sound. The display device 3 may be, for example, a general television receiver. In this case, when there is no event (normal), the display device 3 displays general audio-visual signals (video images based on broadcast signals), and when an event occurs, the display device 3 displays a picture-in-picture image in which an event image is inserted into part of the general audio-visual signal. The display device 3 is not restricted to a television receiver, and may be a dedicated monitor. The image to be displayed does not have to be a picture-in-picture image, and the image may be displayed on the entire screen.

A user makes a decision for the displayed event, and inputs an instruction through the remote controller 4 based on the result of his/her decision. For example, if the user wishes that the event continue to be reported from now on, he/she inputs a corresponding instruction by operating an OK button (OK button 291 shown in FIG. 9, which is described below). Events detected by the processing box 2 change over time based on the instructions input by the user, and only the events desired by the user are detected and reported every time the user uses the monitor system 10.

The sensors and a signal processor (not shown) loaded in the multi-sensor camera unit 1 are operated only when necessary, thereby preventing wasteful power consumption.

Figure 2:
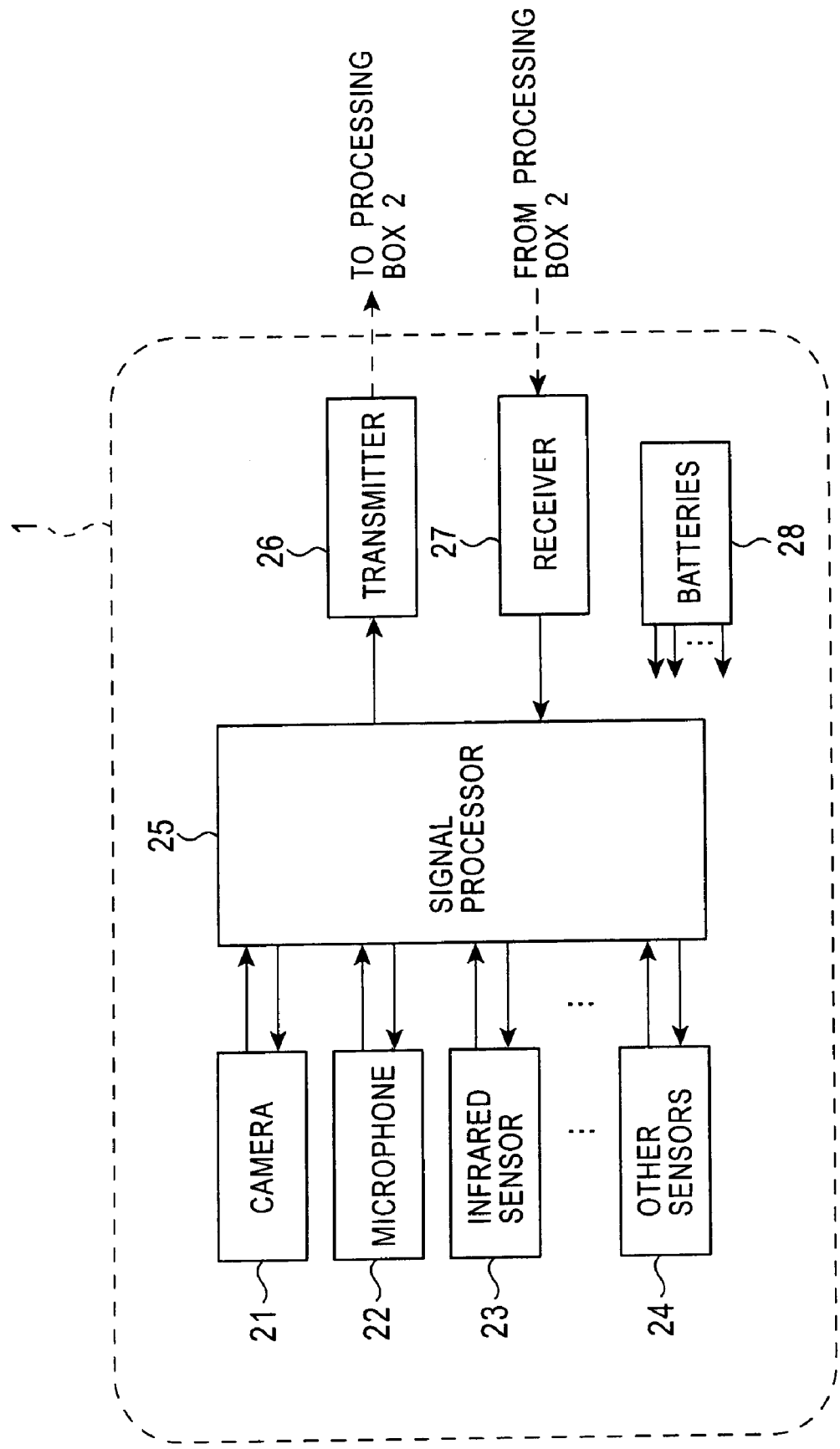
FIG. 2 is a block diagram illustrating the functional configuration of a multi-sensor camera unit shown in FIG. 1.

FIG. 2 is a block diagram illustrating the functional configuration of the multi-sensor camera unit 1 shown in FIG. 1.

The multi-sensor camera unit 1 is provided with a camera 21, a microphone 22, an infrared sensor 23, other sensors 24, a signal processor 25, a transmitter 26, a receiver 27, and batteries 28.

The signal processor 25 detects an event based on data obtained from a plurality of sensors, i.e., the infrared sensor 23 and the other sensors 24, and in case of an event, the signal processor 25 transmits data required for showing the event to the processing box 2 via the transmitter 26 (informs the processing box 2 of the event). If one of the other sensors 24 is, for example, a photo sensor, it senses that a light is turned on indoors. If one of the other sensors 24 is a microwave sensor, it detects the moving distance and the motion of a moving body. The batteries 28 supply required power to the individual elements of the multi-sensor camera unit 1.

The receiver 27 receives a user decision signal, a sensor control signal, or a signal processing control signal sent from the processing box 2 in accordance with an event, and supplies the signals to the signal processor 25. The signal processor 25 performs processing based on the received signals. The multi-sensor camera unit 1 is able to obtain a user decision so as to operate the sensors, the signal processor 25, the transmitter 26, and the receiver 27 required for detecting and displaying an event, thereby reducing the power consumption of the multi-sensor camera unit 1.

Since the multi-sensor camera unit 1 is small and battery-driven, and also has a wireless communication function, it can be installed in various places indoors without the need for a large space or for wiring for supplying power. Since it is provided with a plurality of sensors, the multi-sensor camera unit I is also able to detect various events indoors.

Figure 3:
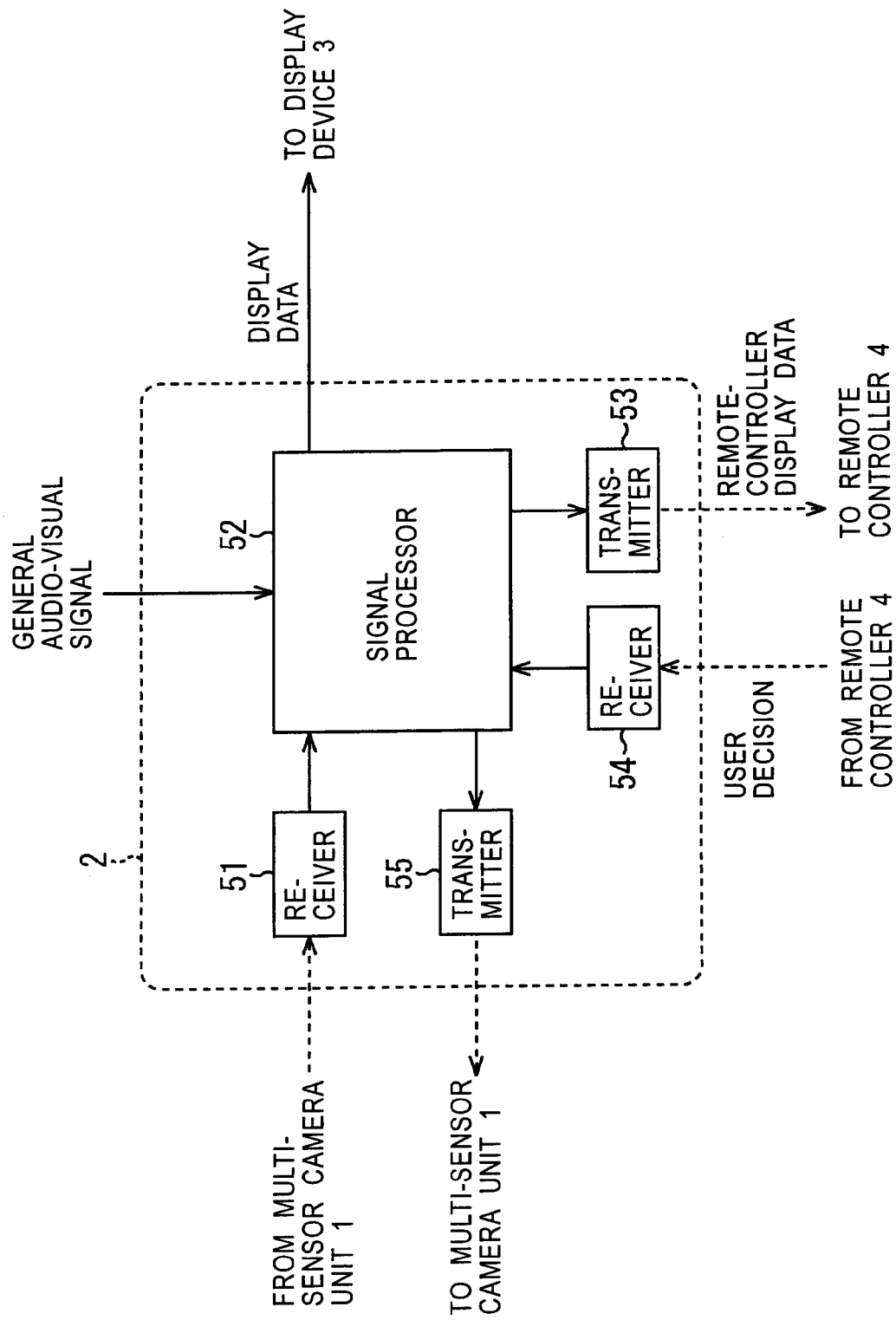
FIG. 3 is a block diagram illustrating the functional configuration of a processing box shown in FIG. 1.

FIG. 3 is a block diagram illustrating the functional configuration of the processing box 2 shown in FIG. 1.

A receiver 51 receives signals sent from the transmitter 26 of the multi-sensor camera unit 1 by wireless means (radio waves), and supplies them to a signal processor 52. The signal processor 52 receives general audio-visual signals (television broadcast signals), and also performs processing or constructs an image to be displayed based on the signal supplied from the receiver 51. In case of an event, the signal processor 52 constructs data to be displayed on the display device 3, and outputs it to the display device 3, and also constructs data to be displayed on the remote controller 4, and sends it to the remote controller 4 via a transmitter 53 by wireless means (infrared or radio waves).

A receiver 54 receives a signal indicating a user decision (user decision signal) transmitted from the remote controller 4 by wireless means (infrared or radio waves), and supplies the signal to the signal processor 52. The signal processor 52 performs processing based on the user decision signal, and also sends required data to the multi-sensor camera unit 1 via a transmitter 55 by wireless means (radio waves).

Figure 4:
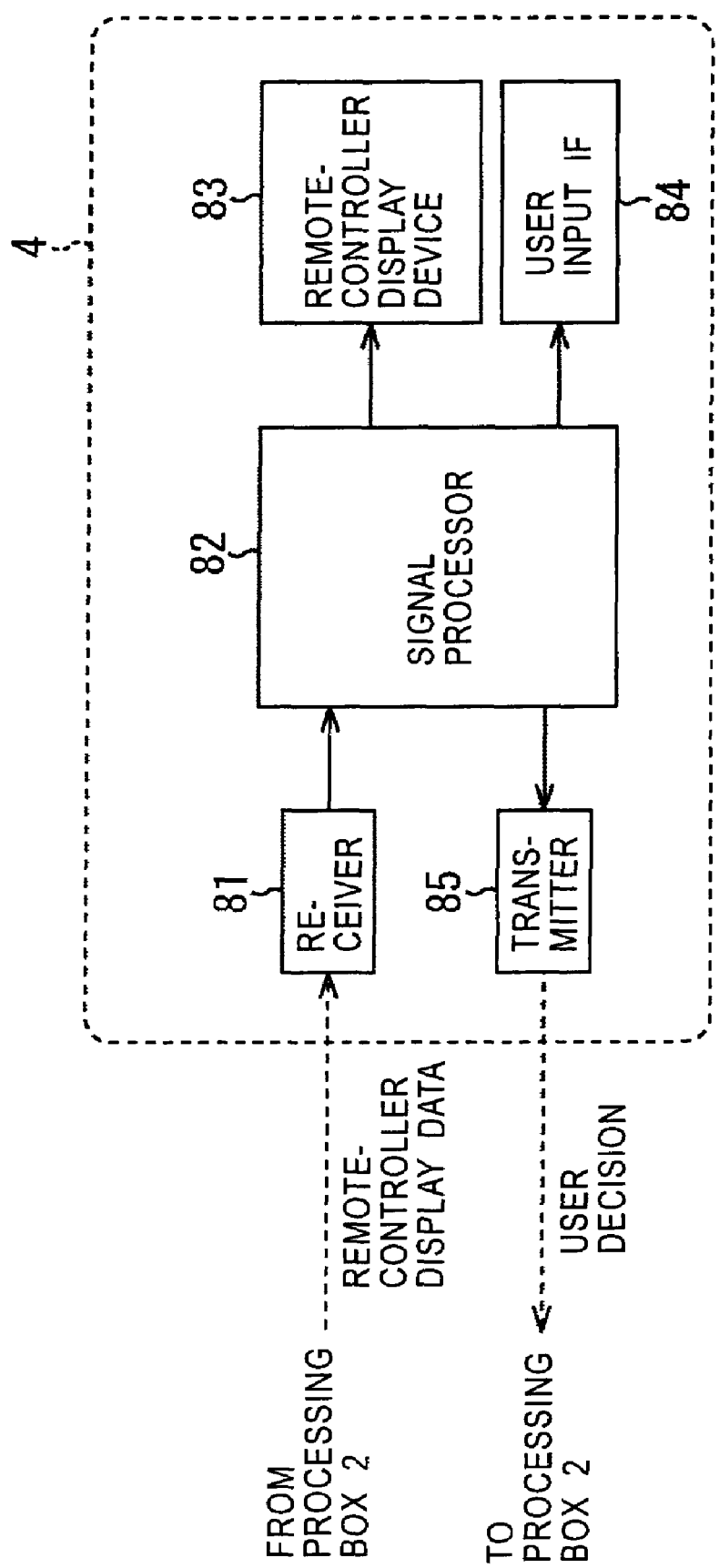
FIG. 4 is a block diagram illustrating the functional configuration of a remote controller shown in FIG. 1.

FIG. 4 is a block diagram illustrating the functional configuration of the remote controller 4 shown in FIG. 1.

A receiver 81 receives a signal (for example, remote-controller display data) sent from the transmitter 53 of the processing box 2 by wireless means (infrared or radio waves), and supplies the signal to a signal processor 82. The signal processor 82 performs processing, such as decoding or coding, on the received signal, based on the signal.

A remote-controller display device 83 displays an image (including characters and symbols) based on the signal sent from the signal processor 82. A user input interface (IF) 84 receives the input of a user decision for an event, and supplies a corresponding signal to the signal processor 82.

In case of an event, the receiver 81 receives remote-controller display data sent from the transmitter 53 of the processing box 2, and the signal processor 82 controls the remote-controller display device 83 to display an image indicating the display data. When a user decision is input into the user input IF 84, a user decision signal is supplied to the signal processor 82. The signal processor 82 sends the user decision signal to the processing box 2 via a transmitter 85 by wireless means (infrared or radio waves).

Two buttons (for example, the OK button 291 and an NO button 292 shown in FIG. 9, which are described below) are disposed on the remote controller 4 so that the user is able to input a user decision for an event, for example, "continue to report" or "no need to continue reporting". Based on the input of the user decision, the multi-sensor camera unit 1 and the processing box 2 change the processing performed.

Figure 5:
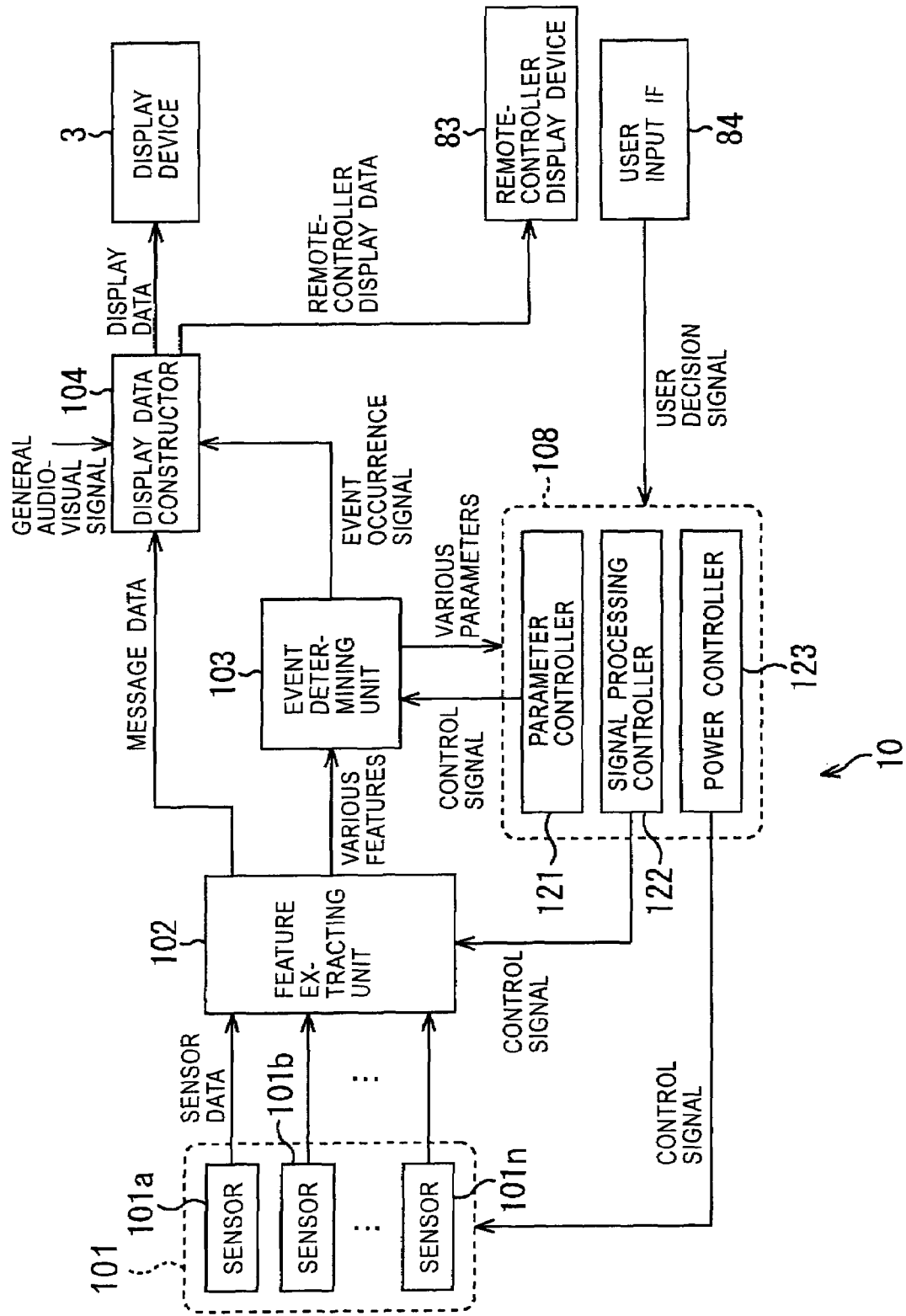
FIG. 5 is a block diagram illustrating the principle configuration of the monitor system shown in FIG. 1.

The principle configuration obtained by connecting the main elements of the monitor system 10 shown in FIG. 1 formed of the multi-sensor camera unit 1, the processing box 2, and the remote controller 4 shown in FIGS. 2, 3, and 4, respectively, is shown in FIG. 5. In FIG. 5, wireless communication channels are also indicated as wired communication channels.

Figure 7:
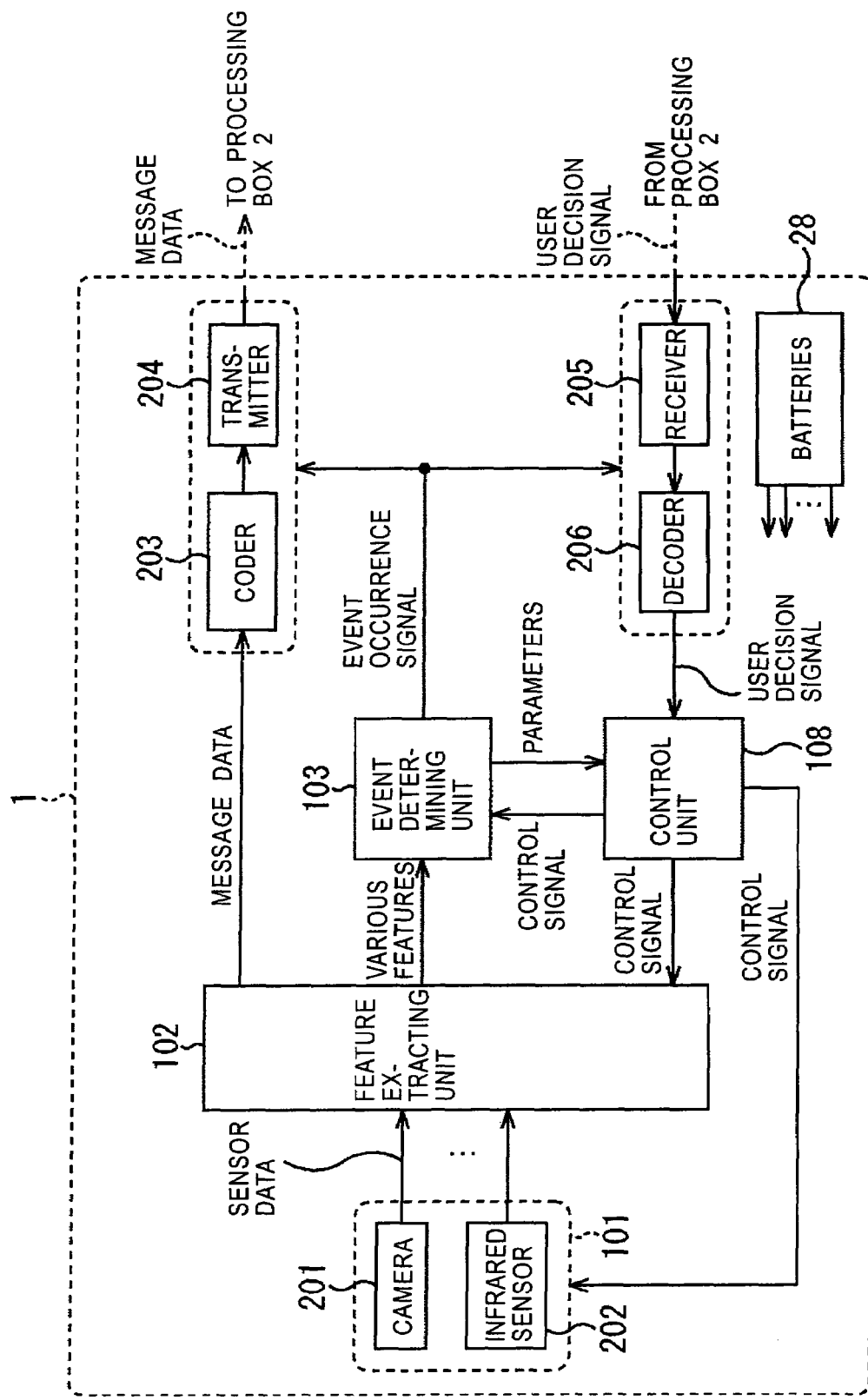
FIG. 7 is a block diagram illustrating the configuration of the multi-sensor camera unit shown in FIG. 1.

A sensor unit 101 formed of plurality of sensors 101a through 101n corresponds to the multi-sensor camera unit 1 shown in FIG. 2. A feature extracting unit 102, an event determining unit 103, a display data constructor 104, and a control unit 108 including a parameter controller 121, a signal processing controller 122, and a power controller 123 correspond to the processing box 2 shown in FIG. 3. A remote-controller display device 83 and a user input IF 84 correspond to the remote controller 4 shown in FIG. 4. The correlations between the main elements shown in FIG. 1 and the elements shown in FIG. 5 are not restricted to the above-described arrangements; for example, the feature extracting unit 102, the event determining unit 103, and part of or the whole control unit 108 may be provided in the multi-sensor camera unit 1 (such a configuration is shown in FIG. 7).

The processing performed by the monitor system 10 shown in FIG. 5 is described below with reference to the flowchart of FIG. 6. This processing starts when the user gives an instruction to start monitoring a monitored area.

In step S1, the feature extracting unit 102 obtains sensor data from each of the sensors 101a through 101n forming the sensor unit 101 disposed in the monitored area.

In step S2, the feature extracting unit 102 calculates a feature from each type of sensor data obtained in step S1. More specifically, the feature extracting unit 102 determines, for example, an inter-frame difference of an image signal, so as to calculate the center of gravity of the inter-frame difference indicating the position of a moving object. Alternatively, the feature extracting unit 102 calculates the amount by which the data of an infrared sensor changes.

In step S3, the event determining unit 103 obtains the features calculated by the feature extracting unit 102.

In step S4, the event determining unit 103 determines whether an event has occurred based on each feature obtained in step S3. In this case, the event determining unit 103 determines whether an event has occurred based on event-determining parameters possessed by the event determining unit 103. The parameters are updated under the control of the parameter controller 121. If it is determined in step S4 that an event has occurred, the process proceeds to step S5. In step S5, the event determining unit 103 supplies an event occurrence signal indicating that an event has occurred and data required for reporting and displaying the event to the display data constructor 104.

In step S6, the display data constructor 104 obtains the event occurrence signal and data required for reporting and displaying the event from the event determining unit 103, and constructs display data in which event display data is inserted into part of a general audio-visual signal (television broadcast signal). The display data constructor 104 also constructs display data for the remote controller 4 (hereinafter referred to as "remote-controller display data") formed of the event display data without the general audio-visual signal.

In step S7, the display data constructor 104 outputs the display data constructed in step S6 to the display device 3, and controls the display device 3 to display the data. The display data constructor 104 also outputs the remote-controller display data to the remote-controller display device 83, and controls the remote-controller display device 83 to display the remote-controller display data.

Since the display data is formed by inserting event display data into part of a general audio-visual signal, a picture-in-picture image, such as that shown in FIG. 15, which is described below, is displayed on the display device 3. Since the remote-controller display data is formed of only event display data, an image indicating an event only (for example, an image of the place where monitoring is conducted) is displayed on the remote-controller display device 83.

By viewing the event (image and sound) reported and displayed on the remote-controller display device 83, the user inputs a decision for the event, for example, whether or not the user wishes that the event continue to be reported. In this case, an image for instructing the user to input a decision may be displayed on the remote-controller display device 83. When a decision is input from the user, in step S8, the user input IF 84 obtains the input of the user decision for the event. The user input IF 84 then supplies a user decision signal indicating the user decision to the control unit 108 formed of the parameter controller 121, the signal processing controller 122, and the power controller 123.

In step S9, the parameter controller 121 updates event determining parameters possessed by the event determining unit 103 based on the user decision signal obtained in step S8 so that events can be detected in response to the user instruction. For example, if the parameters are set such that an event occurrence signal is generated when a brightness having a level of a reference value or higher is detected, the reference value can be changed to be higher or lower.

In step S10, the signal processing controller 122 controls the feature extracting unit 102 based on the user decision signal obtained in step S8. More specifically, the signal processing controller 122 controls the feature extracting unit 102 to stop detecting unnecessary features or to switch from lighter processing (for example, detecting smaller number of features) to heavier processing (for example, detecting larger number of features) so as to perform more precise detection. In FIG. 15, for example, for a portion 322, which should be detected as an event, and a portion 323, which should not be detected as an event, the signal processing controller 122 controls the feature extracting unit 102 so as not to detect the portion 323 as a feature even though the image of a person is captured and contained in the portion 323.

In step S11, the power controller 123 controls the power source of the sensor unit 101 to be turned ON or OFF based on the user decision signal obtained in step S8. More specifically, among the sensors 101a through 101n, the power controller 123 controls the power sources of the sensors unnecessary for the feature extracting unit 102 and for the event determining unit 103 to be turned OFF, thereby preventing unnecessary consumption of the batteries.

After step S11, the process returns to step S1, and processing similar to the above-described processing is repeated.

If the event determining unit 103 determines in step S4 that an event has not occurred, the process proceeds to step S12. In step S12, the display data constructor 104 outputs a general audio-visual signal (television broadcast signal) to the display device 3 as the display data, and the display device 3 displays the general audio-visual signal. Then, the process returns to step S1, and step S1 and the subsequent steps are then repeated.

Figure 6:
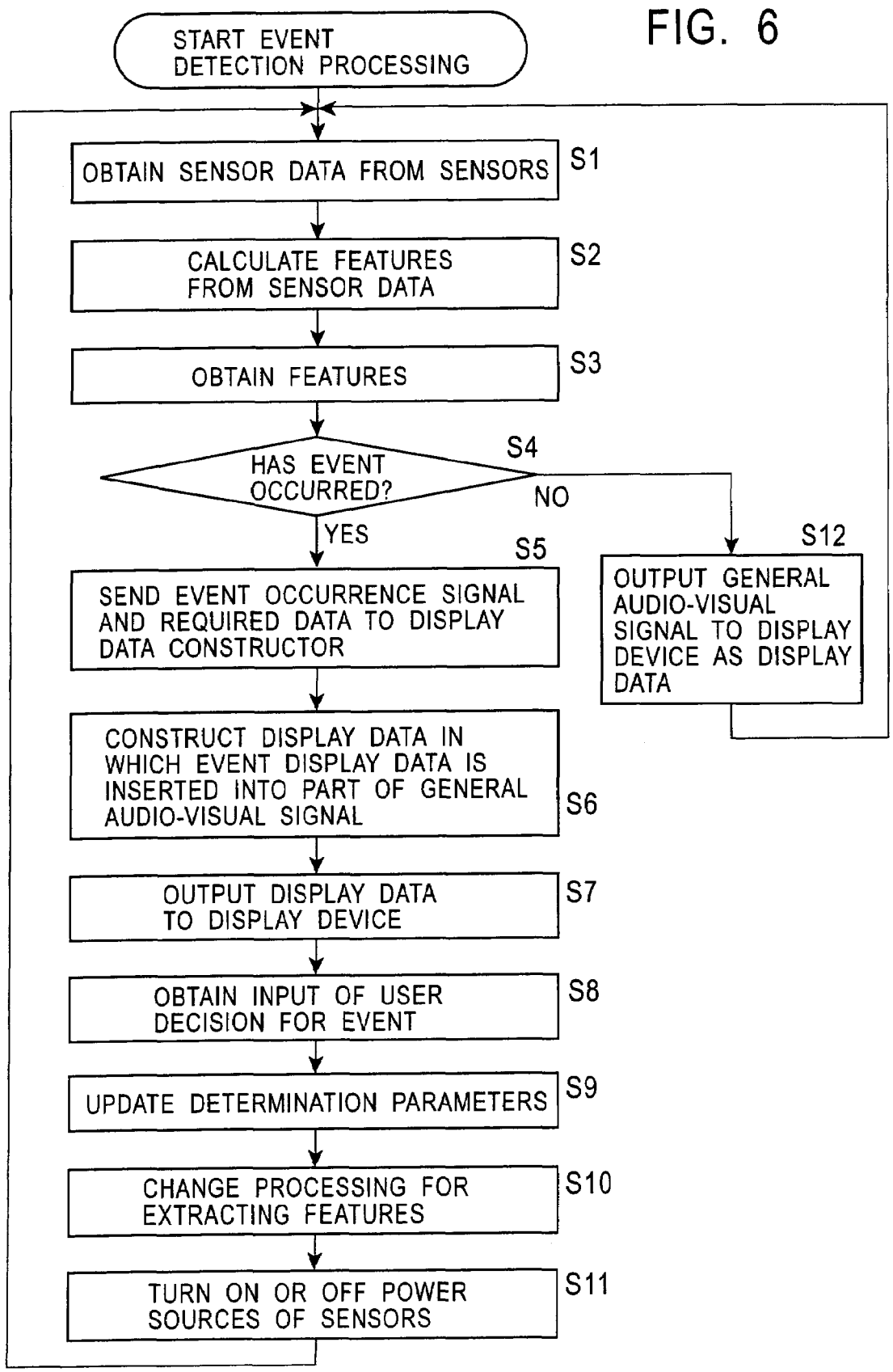
FIG. 6 is a flowchart illustrating event detection processing performed by the monitor system shown in FIG. 5.

According to the processing shown in FIG. 6, by inputting a simple decision, the user is able to reliably detect only desired events, and the sensors and the processors are operated only when necessary, thereby reducing the power consumption of the multi-sensor camera unit 1.

A specific example of the monitor system (home security system) 10 is described below with reference to FIGS. 7 through 18.

Figure 8:
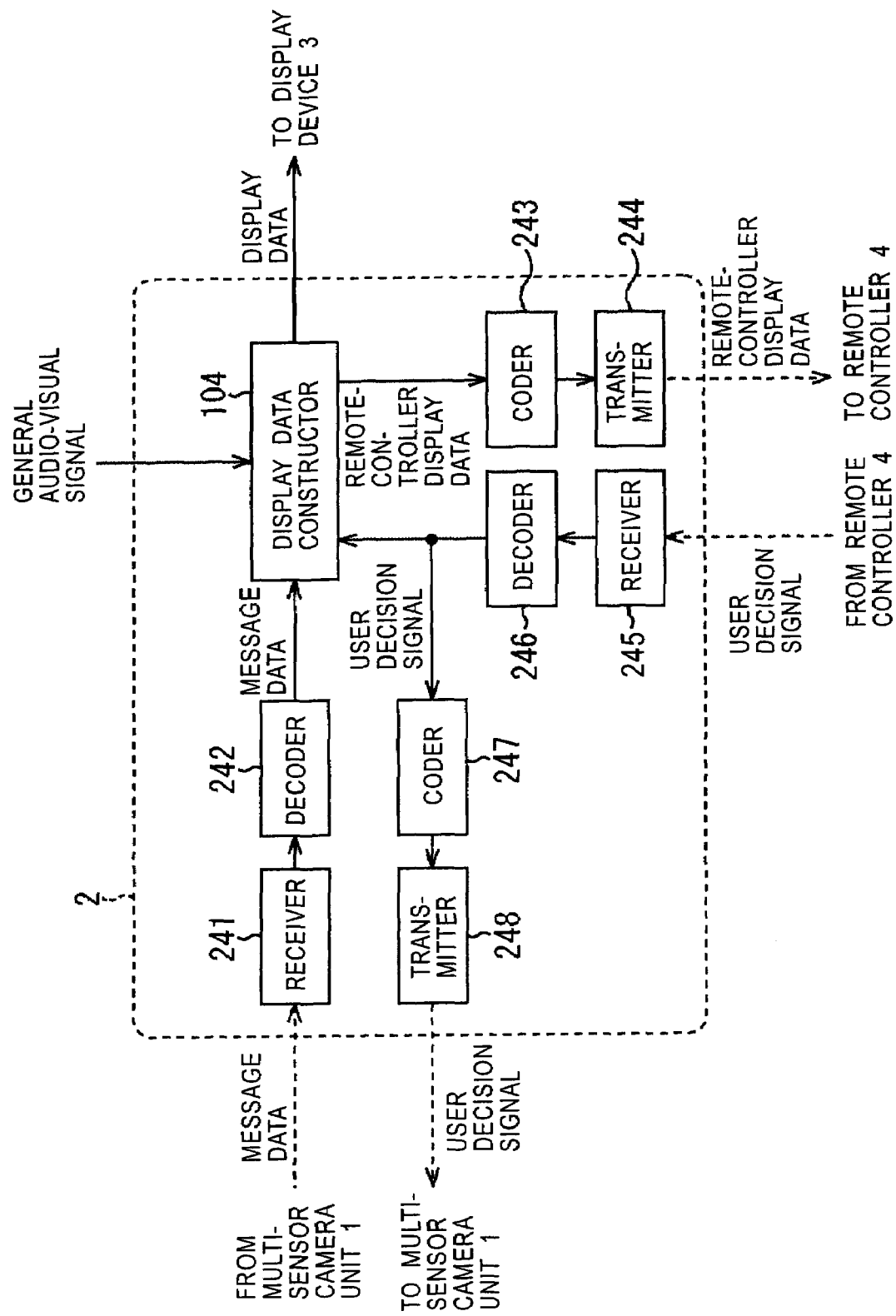
FIG. 8 is a block diagram illustrating the configuration of the processing box shown in FIG. 1.
Figure 10:
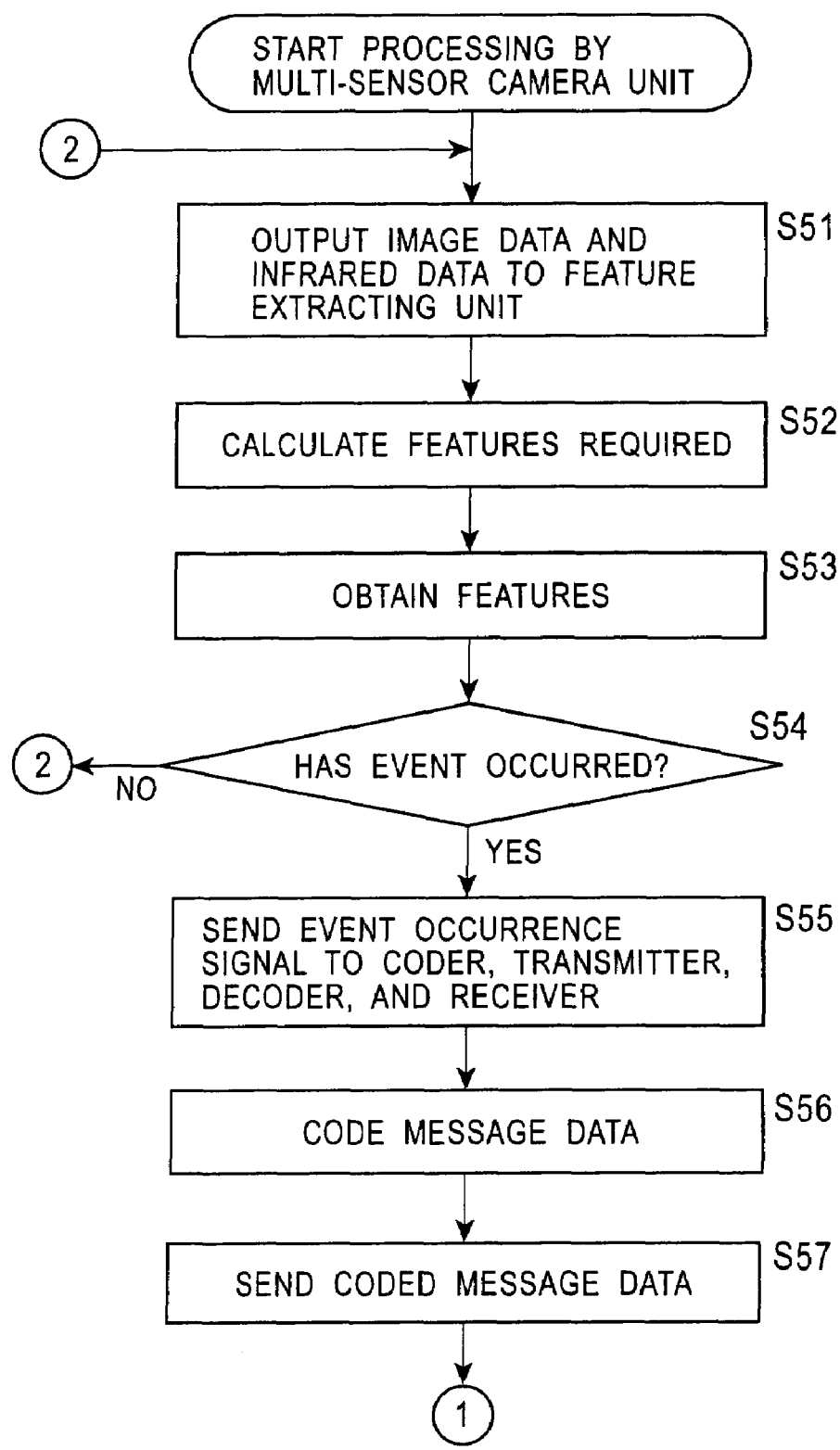
FIGS. 10 and 11 are a flowchart illustrating processing performed by the multi-sensor camera unit shown in FIG. 7.
Figure 11:
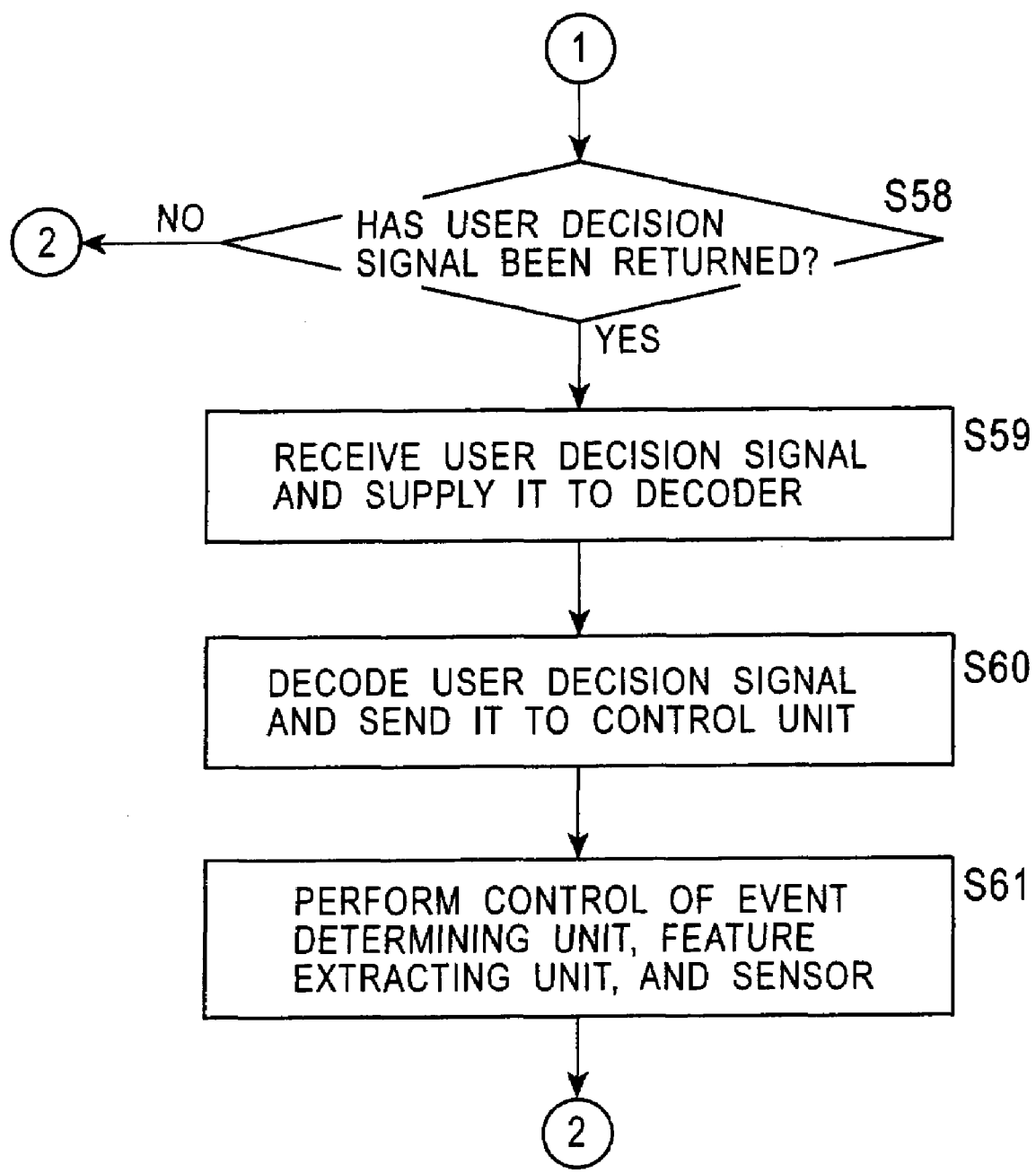
Figure 12:
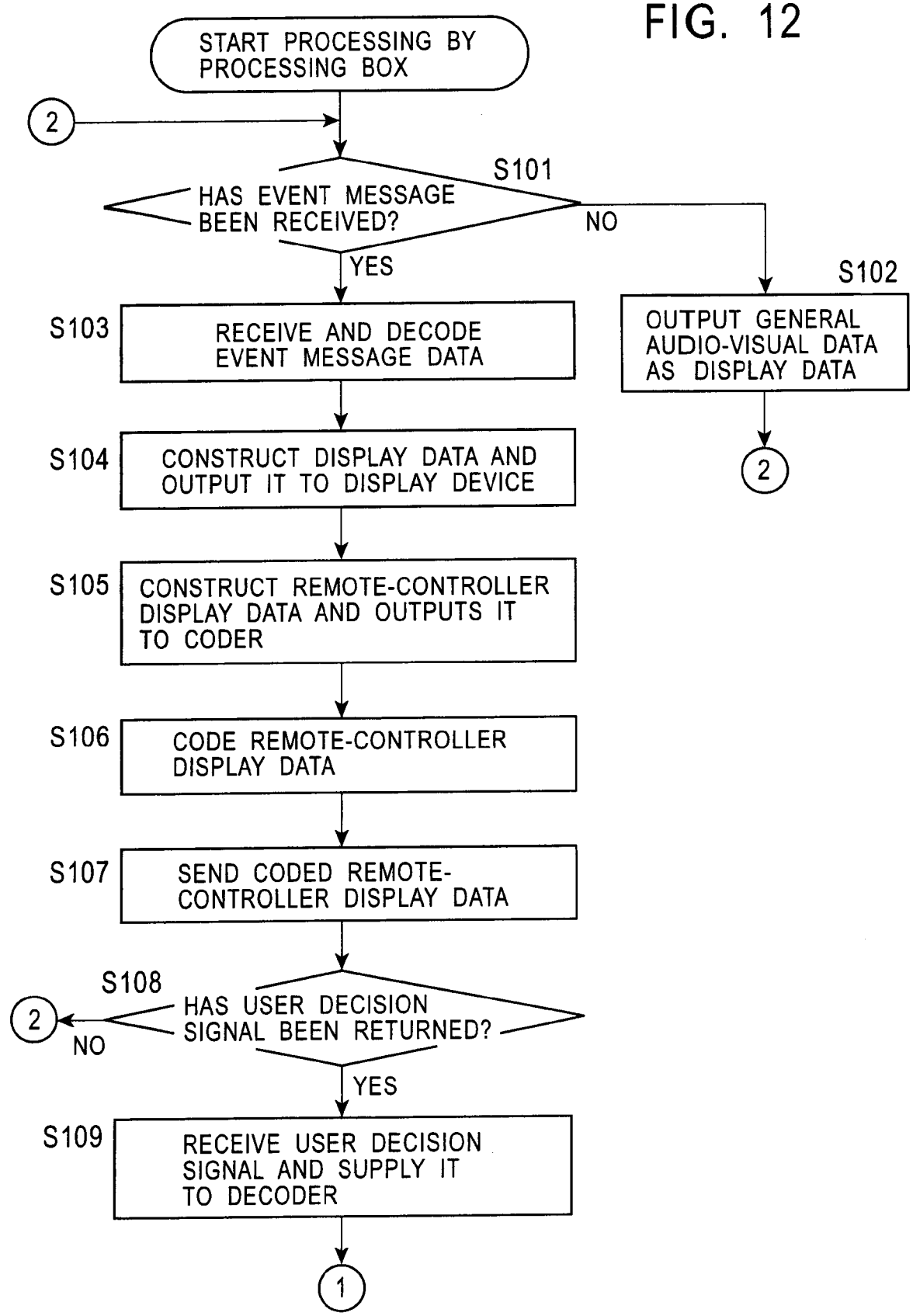
FIGS. 12 and 13 are a flowchart illustrating processing performed by the processing box shown in FIG. 8.
Figure 13:
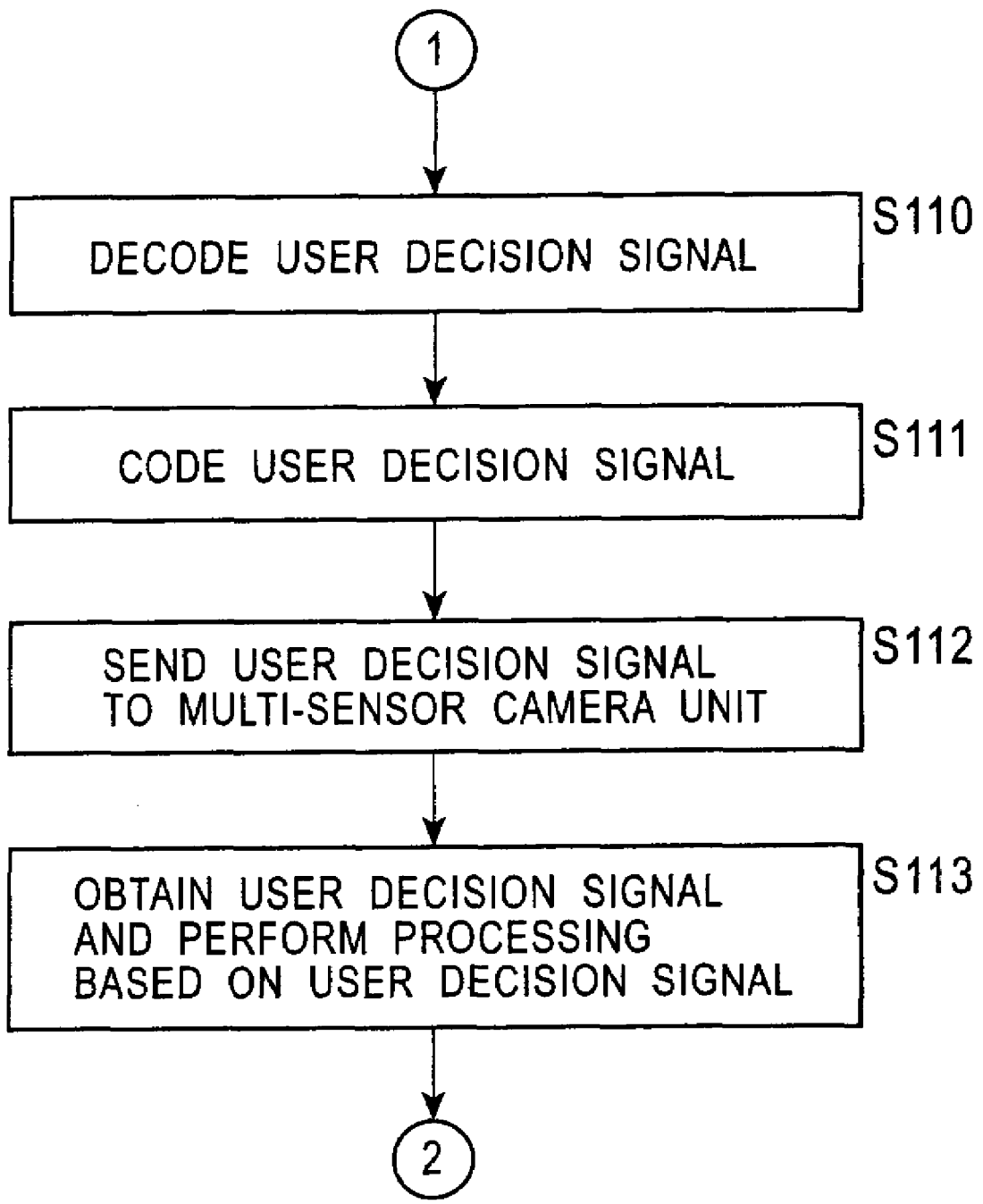
Figure 14:
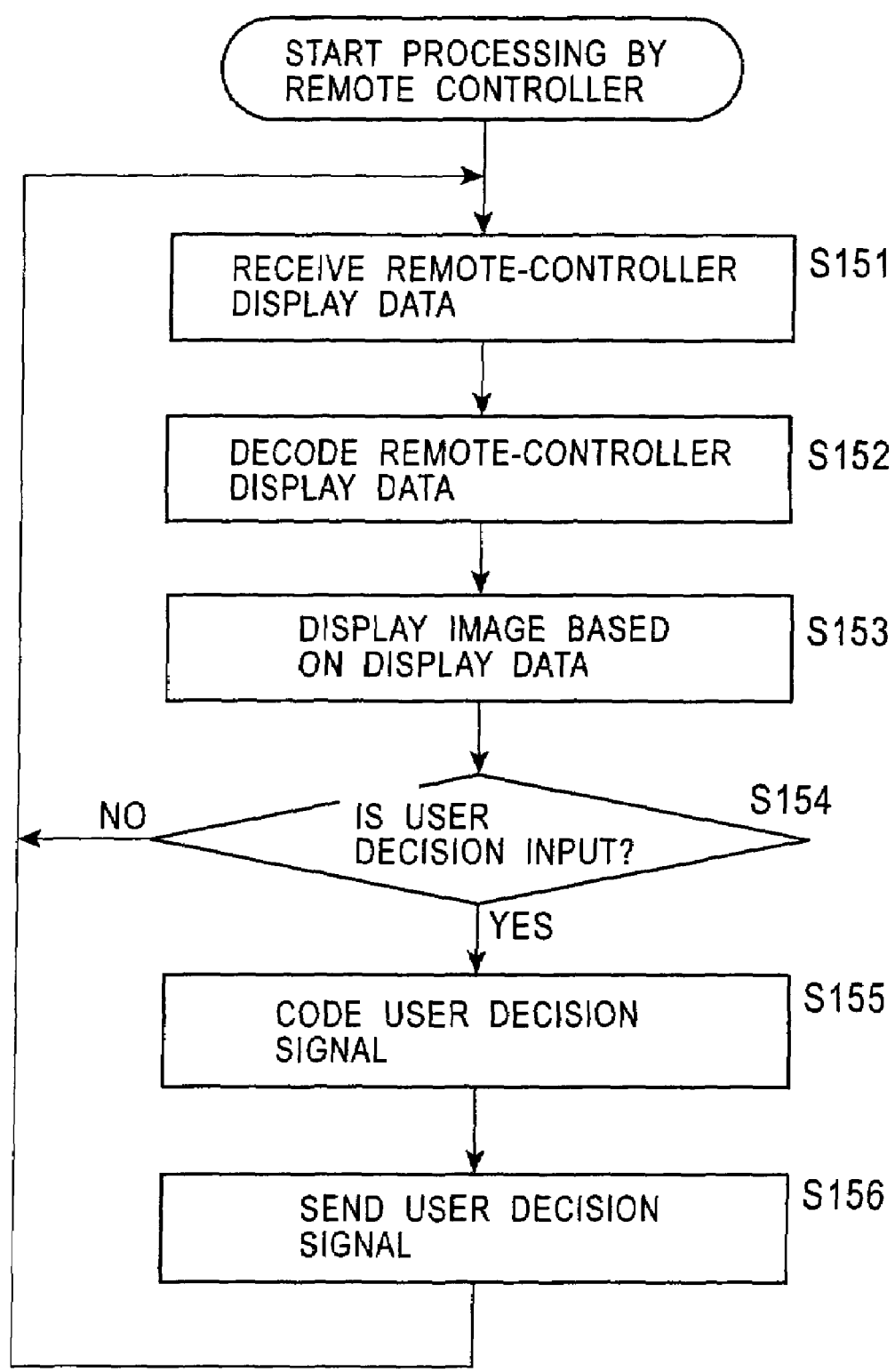
FIG. 14 is a flowchart illustrating processing performed by the remote controller shown in FIG. 9.
Figure 17:
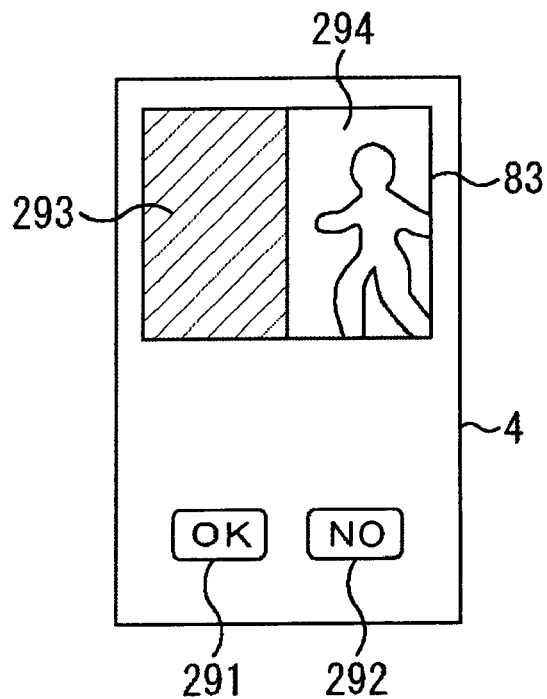
FIGS. 17 and 18 illustrate display examples in the processing of step S153 of FIG. 14.
Figure 18:
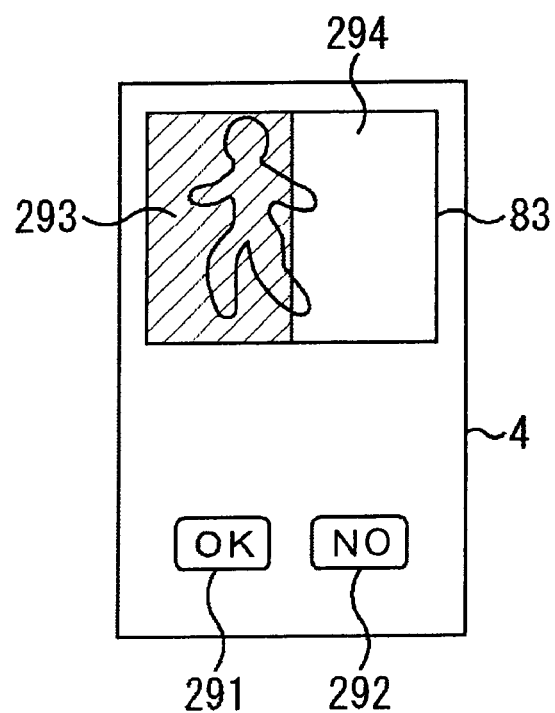

In this example, a camera 201 and an infrared sensor 202 (FIG. 7) are used as sensors, and the user inputs an instruction for a displayed event by operating the OK button 291 indicating "OK (needs to be detected from now on)" or the NO button 292 indicating "NO (no need to be detected)". In this case, the configuration of the multi-sensor camera unit 1 is shown in FIG. 7, the configuration of the processing box 2 is shown in FIG. 8, and the configuration of the remote controller 4 is shown in FIG. 9. The processing by the multi-sensor camera unit 1 is shown in FIGS. 10 and 11, the processing by the processing box 2 is shown in FIGS. 12 and 13, and the processing by the remote controller 14 is shown in FIG. 14. Images displayed on the display device 3 are shown in FIGS. 15 and 16. Images displayed on the remote-controller display device 83 are shown in FIGS. 17 and 18. The same elements as those shown in FIG. 5 are indicated by like reference numerals, and an explanation thereof is thus omitted.

In FIG. 7, sensor data obtained by the camera 201 and the infrared sensor 202 is supplied to the feature extracting unit 102. Under the control of the control unit 108, for example, the infrared sensor 202 is always turned ON and the camera 201 is normally turned OFF to reduce power consumption. The feature extracting unit 102 extracts features from the sensor data obtained by the infrared sensor 202, and supplies them to the event determining unit 103.

Message data used for reporting the occurrence of an event is supplied from the feature extracting unit 102 to a coder 203. The coder 203 codes the message data and supplies it to a transmitter 204. In case of the occurrence of an event, the transmitter 204 sends the coded message data to the processing box 2. A user decision signal sent from the processing box 2 is received by a receiver 205, decoded by a decoder 206, and then supplied to the control unit 108. The control unit 108 performs processing based on the user decision signal, as described above.

More specifically, as described with reference to FIG. 5, the control unit 108 controls the event determining unit 103 to update the event determination parameters, or controls the feature extracting unit 102 to start or stop extracting the features of an image, or the camera 201 or the infrared sensor 202 to be turned ON or OFF.

The coder 203, the transmitter 204, the receiver 205, and the decoder 206 are also controlled to perform processing only when an event occurs. Accordingly, the multi-sensor camera unit 1 can be operated without wastefully consuming power.

When an event message (message data) is sent from the transmitter 204 of the multi-sensor camera unit 1, it is received by a receiver 241 of the processing box 2 shown in FIG. 8. The message data is decoded by a decoder 242, and is then supplied to the display data constructor 104. As stated above, the display data constructor 104 constructs display data by superposing an event signal on a general audio-visual signal, and outputs the display data to the display device 3. The display data constructor 104 also controls a coder 243 to code the event data itself as the remote-controller display data, and controls a transmitter 244 to send the remote-controller display data. When an event message (message data) is not sent from the multi-sensor camera unit 1, i.e., when there is no event, the display data constructor 104 outputs a general audio-visual signal to the display device 3 as the display data, and controls the display device 3 to display it.

After sending the remote-controller display data, a user decision signal is returned form the remote controller 4. Then, a receiver 245 of the processing box 2 receives the user decision signal and supplies it to a decoder 246. The decoder 246 decodes the user decision signal, and supplies it to the display data constructor 104 and a coder 247. The display data constructor 104 performs, for example, processing for stopping generating a picture-in-picture image, based on the user decision signal. The coder 247 codes the supplied user decision signal, and supplies it to a transmitter 248. The user decision signal is transmitted from the transmitter 248 and is received by the receiver 205 of the multi-sensor camera unit 1.

Figure 9:
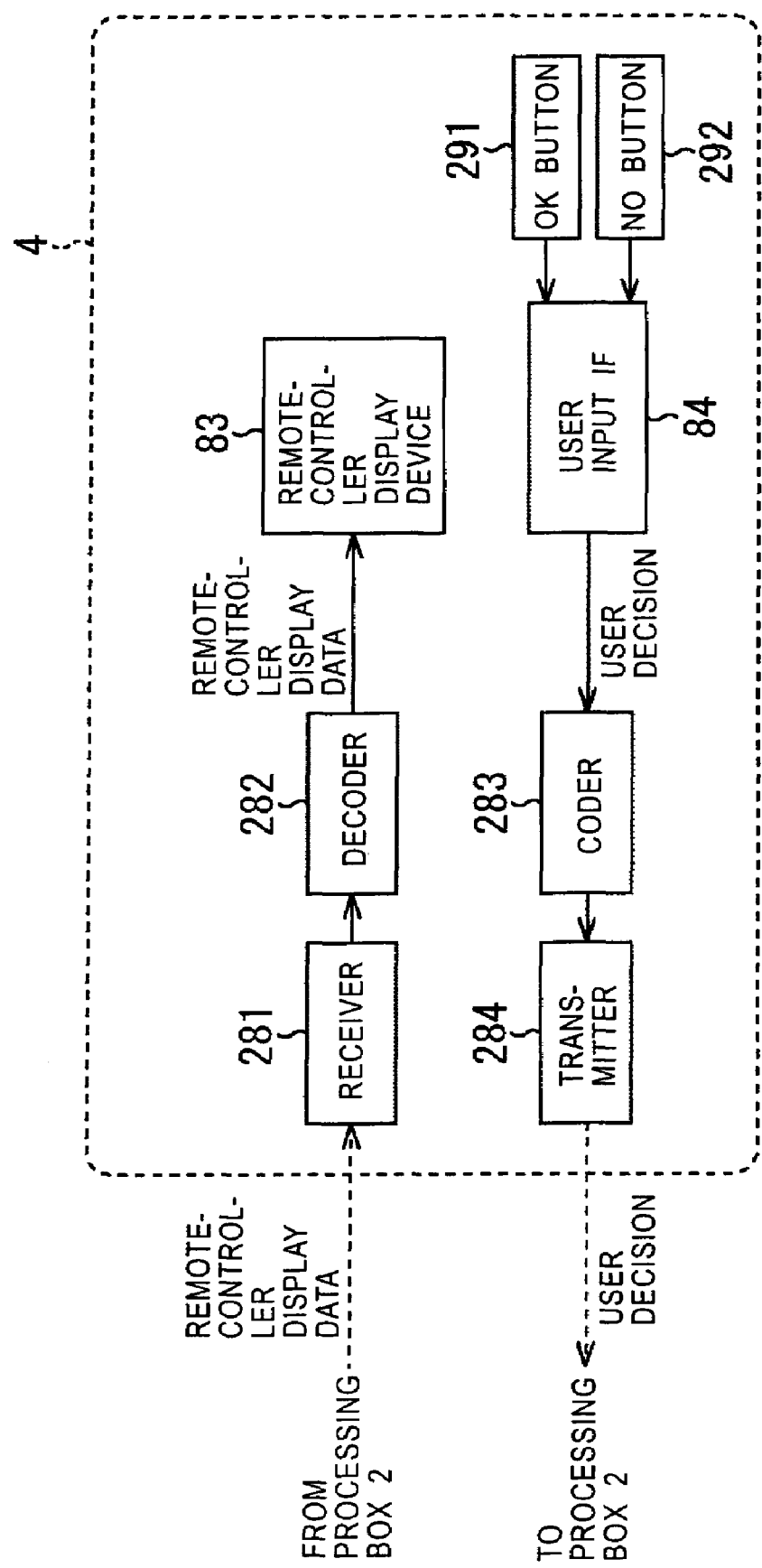
FIG. 9 is a block diagram illustrating the configuration of the remote controller shown in FIG. 1.

When the remote-controller display data is sent from the transmitter 244 of the processing box 2, a receiver 281 of the remote controller 4 shown in FIG. 9 receives the remote-controller display data, and supplies it to a decoder 282. The decoder 282 decodes the remote-controller display data, and controls the remote-controller display device 83 to display an image based on the decoded remote-controller display data.

The user then operates the OK button 291 or the NO button 292 to input a user decision indicating whether the corresponding event is to be detected.

The user input IF 84 detects that the OK button 291 or the NO button 292 has been operated, and supplies a detection result to a coder 283 as a user decision signal. The coder 283 codes the user decision signal and sends it to a transmitter 284. The transmitter 284 then sends the user decision signal to the receiver 245 of the processing box 2.

The processing by the multi-sensor camera unit 1 shown in FIG. 7, the processing by the processing box 2 shown in FIG. 8, and the processing by the remote controller 4 shown in FIG. 9 are described below with reference to the flowcharts of FIGS. 10 through 14.

A description is first given of the processing by the multi-sensor camera unit 1 shown in FIG. 7 with reference to the flowcharts of FIGS. 10 and 11. This processing starts when a user gives an instruction to start monitoring a monitored area.

In step S51, the camera 201 and the infrared sensor 202, which are considered to be necessary sensors, obtain image data and detection data, respectively, as sensor data, and supply them to the feature extracting unit 102. Although in this example both the camera 201 and the infrared sensor 202 are operated, only the infrared sensor 102 or only the camera 201 may be operated.

In step S52, the feature extracting unit 102 calculates the features required. More specifically, the feature extracting unit 102 calculates the features required, for example, an inter-frame difference of image data output from the camera 201, the center of gravity of the inter-frame difference of the image data, and an amount by which the sensor data output from the infrared sensor 202 changes. The features required change from time to time under the control of the control unit 108. The feature extracting unit 102 supplies the calculated features to the event determining unit 103, and also supplies them to the coder 203 as message data.

In step S53, the event determining unit 103 obtains the features calculated and supplied in step S52.

In step S54, the event determining unit 103 determines whether an event has occurred based on the obtained features. In this case, the event determining unit 103 determines the occurrence of an event based on the event determining parameters possessed in the event determining unit 103. The parameters are updated under the control of the control unit 108. If it is determined in step S54 that an event has occurred, the process proceeds to step S55. In step S55, the event determining unit 103 sends an event occurrence signal to the coder 203, the transmitter 204, the receiver 205, and the decoder 206. Upon receiving the event occurrence signal, the coder 203, the transmitter 204, the receiver 205, and the decoder 206 become operable. Accordingly, when an event occurrence signal is not supplied, the above elements are not operable (OFF), thereby inhibiting wasteful power consumption.

In step S56, the coder 203 receives and codes the message data sent from the feature extracting unit 102 in step S52, and supplies the coded message data to the transmitter 204.

In step S57, the transmitter 204 sends the message data supplied and coded by the coder 203 to the processing box 2.

The processing box 2 receives the message data (in step S103 of FIG. 12, which is described below), and returns a user decision signal in response to this message data (in step S112 of FIG. 13, which is described below).

In step S58, the receiver 205 determines whether a user decision signal has been returned. If the user decision signal has been returned, the process proceeds to step S59. In step S59, the receiver 205 receives the user decision signal and supplies it to the decoder 206.

In step S60, the decoder 206 decodes the user decision signal and supplies it to the control unit 108.

In step S61, the control unit 108 controls the parameter updating processing of the event determining unit 103, the signal processing of the feature extracting unit 102, and the power supply to the sensors. Details have been described above with reference to FIGS. 5 and 6, and an explanation thereof is thus omitted.

If it is determined in step S54 that an event has not occurred, or if it is determined in step S58 that a user decision signal has not been returned, or after step S61, the process returns to step S51, and step S51 and the subsequent steps are then repeated.

The processing performed by the processing box 2 shown in FIG. 8 corresponding to the processing by the multi-sensor camera unit 1 shown in FIGS. 10 and 11 is now described with reference to FIGS. 12 and 13. This processing starts when a user gives an instruction to start displaying an image corresponding to a general audio-visual signal (broadcast program signal) on the display device 3 or to start monitoring a monitored area.

In step S101, the receiver 241 determines whether an event message has been received. More specifically, the receiver 241 determines whether message data has been sent from the transmitter 204 of the multi-sensor camera unit 1. If it is determined in step S 101 that an event message (message data) has not been sent, the process proceeds to step S102. In step S102, the display data constructor 104 outputs a general audio-visual signal to the display device 3 as the display data, and controls the display device 3 to display it. Thereafter, the process returns to step S101, and step S101 and the subsequent steps are then repeated.

If it is found in step S101 that an event message has been sent, the process proceeds to step S103. In step S103, the receiver 241 receives the message data and outputs it to the decoder 242. The decoder 242 decodes the message data, and supplies the decoded message data to the display data constructor 104.

In step S104, the display data constructor 104 receives the message data and constructs display data. More specifically, the display data constructor 104 constructs display data (picture-in-picture image) by superposing an event image on part of a general audio-visual signal. Then, the display data constructor 104 outputs the display data to the display device 3, and controls the display device 3 to display it.

Figure 15:
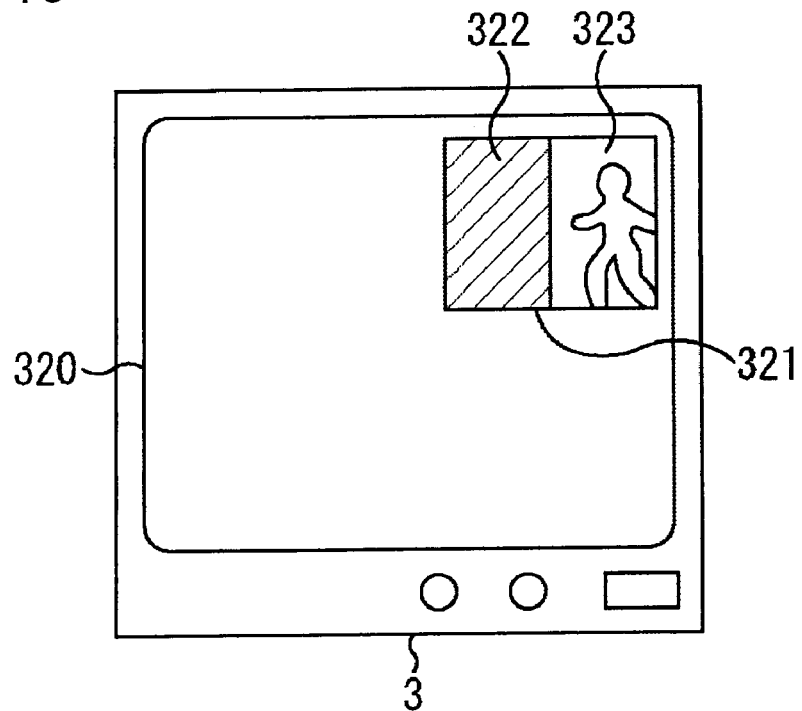
FIGS. 15 and 16 illustrate display examples in the processing of step S104 of FIG. 12.
Figure 16:
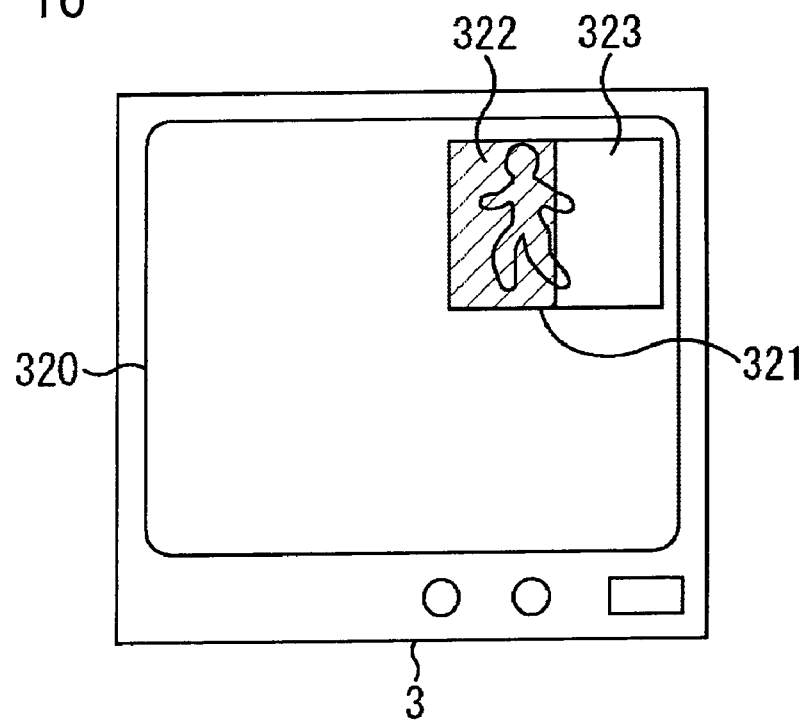

In this case, an image shown in FIG. 15 or FIG. 16 is displayed on the display device 3. In the example shown in FIG. 15, an event display area 321 is displayed as part of a general audio-visual screen 320 on the display device 3. Between the left-side portion 322 and the right-side portion 323 of the event display area 321, an image of a person captured by the camera 201 is contained in the right-side portion 323. In response to this event display, the user operates the OK button 291 indicating "need to be detected" or the NO button 292 indicating "no need to be detected" of the remote controller 4 so as to input a user decision. The resulting user decision signal is returned from the remote controller 4 (step S156 of FIG. 14, which is described below).

If the user wishes that the left-side portion 322 be detected as an event rather than the right-side portion 323, the user operates the NO button 292 for the event display shown in FIG. 15. Then, a user decision signal corresponding to the operation of the NO button 292 is returned from the remote controller 4. The processing box 2 receives the user decision signal and sends it to the multi-sensor camera unit 1 (step S112 of FIG. 13, which is described below). As stated above, upon receiving this user decision signal, the control unit 108 of the multi-sensor camera unit 1 controls the feature extracting unit 102 to exclude the right-side area of the viewing angle of the camera 201 from the feature extracting area (step S61 of FIG. 11). As a result, even if an image of a person is captured in the right-side area of the viewing angle, an event occurrence signal is not generated, but when an image of a person is captured in the left-side area of the viewing angle, an event message is sent. Then, an image, such as that shown in FIG. 16, is displayed.

When the user operates the NO button 292, only a general audio-visual image is displayed on the display device 3 without displaying the event display area 321. Accordingly, the user is able to view only the desired areas on the screen.

Returning to FIG. 12, in step S105, the display data constructor 104 constructs remote-controller display data and outputs it to the coder 243. The remote-controller display data is formed of only message data without containing a general audio-visual signal. Upon receiving the remote-controller display data, the remote controller 4 displays a corresponding image, such as that shown in FIG. 17 or 18 (step S153 of FIG. 14, which is described below).

In step S106, the coder 243 codes the remote-controller display data supplied in step S105, and supplies it to the transmitter 244.

In step S107, the transmitter 244 sends the remote-controller display data coded and supplied in step S106 to the remote controller 4. Upon receiving the coded remote-controller display data (step S151 of FIG. 14, which is described below), the remote controller 4 displays it (step S153, which is described below), and then, returns a user decision signal based on the user decision (step S156 of FIG. 14, which is described below).

Then, in step S108, the receiver 245 determines whether a user decision signal has been returned. If so, in step S109, the receiver 245 receives the user decision signal and supplies it to the decoder 246.

In step S110, the decoder 246 decodes the user decision signal supplied in step S109, and supplies it to the display data constructor 104 and also to the coder 247.

In step S111, the coder 247 codes the user decision signal supplied in step S110, and supplies it to the transmitter 248.

In step S112, the transmitter 248 sends the user decision signal coded and supplied in step S111 to the multi-sensor camera unit 1. The multi-sensor camera unit 1 performs processing based on the user decision signal, as discussed above (step S61 of FIG. 11).

In step S113, the display data constructor 104 obtains the user decision signal decoded in step S110, and performs processing based on the user decision signal.

In this case, as described above, if the user decision signal contains an instruction to stop constructing display data (when the NO button 292 shown in FIG. 17 is operated), the display data constructor 104 stops constructing display data including event images. In this case, the event display area 321 is not displayed on the display device 3.

If the user decision signal contains an instruction to continue constructing image data (when the OK button 291 shown in FIG. 17 is operated), the display data constructor 104 continues constructing display data including event images. In this case, the event display area 321, such as that shown in FIG. 16, is displayed on the display device 3.

After step S102, or if it is determined in step S108 that a user decision signal has not been returned, or after step S113, the process returns to step S101, and step S101 and the subsequent steps are then repeated.

A description is now given, with reference to FIG. 14, of the processing performed by the remote controller 4 shown in FIG. 9 corresponding to the processing by the processing box 2 shown in FIGS. 12 and 13. This processing starts when the transmitter 244 of the processing box 2 performs the processing in step S107 of FIG. 12.

In step S151, the receiver 281 receives the remote-controller display data sent from the transmitter 244 of the processing box 2 in step S107 of FIG. 12, and supplies it to the decoder 282.

In step S152, the decoder 282 decodes the remote-controller display data received in step S151, and supplies the decoded data to the remote-controller display device 83.

In step S153, the remote-controller display device 83 displays an image based on the received remote-controller display data.

In this case, an image, such as that shown in FIG. 17 or 18, is displayed on the remote-controller display device 83. This image is similar to that of the event display area 321 shown in FIGS. 15 and 16. That is, the remote-controller display data contains data only corresponding to the event display area 321 of the display data output to the display device 3.

In the example shown in FIG. 17, an event based on the remote-controller display data is displayed on the remote-controller display device 83. Between a left-side portion 293 and a right-side portion 294 of the image displayed on the remote-controller display device 83, if the user wishes that the left-side portion 293 be detected as an event, the user operates the NO button 292 for the right-side portion 294 containing an image of a person, as shown in FIG. 17. In contrast, the user operates the OK button 291 for the left-side portion 293 containing an image of a person, as shown in FIG. 18.

In step S154, the user input IF 84 determines whether a user decision is input, i.e., whether the OK button 291 or the NO button 292 is operated. If it is determined that a user decision is input, the process proceeds to step S155. In step S155, the user input IF 84 supplies a user decision signal corresponding to the user decision to the coder 283, and the coder 283 codes the user decision signal. Then, the coder 283 supplies the coded user decision signal to the transmitter 284.

In step S156, the transmitter 284 sends the user decision signal coded in step S155 to the processing box 2. The multi-sensor camera unit 1 and the processing box 2 receive the user decision signal (in step S59 of FIG. 11 and in step S109 of FIG. 12, respectively), and perform processing based on the user decision signal, as described above. For example, if the user decision signal indicating that the user has operated the NO button 292 for the display shown in FIG. 17, the multi-sensor camera unit 1 excludes the right-side area of the viewing angle (range) to be captured by the camera 201 from the feature extracting area. As a result, an image containing a person at the right-side portion 294, such as that shown in FIG. 17, is not sent, and an image containing a person at the left-side portion 293, such as that shown in FIG. 18, is displayed as an event image.

If it is determined in step S154 that a user decision is not input, or after step S156, the process returns to step S151, and step S151 and the subsequent steps are then repeated.

The processing of the multi-sensor camera unit 1 may be changed, for example, as follows. The camera 201 and the infrared sensor 202 are controlled to be always turned ON during a predetermined period (when the number of user decisions input is lower than a predetermined number) after the start of the use of the monitor system 10. Then, after the lapse of the predetermined period (when the number of user decisions input reaches the predetermined number), the camera 201 is turned OFF, and, when the infrared sensor 202 is operated, the camera 201 is turned ON.

The event determining unit 103 may change the determination parameters, for example, as follows. The event determining unit 103 outputs an event occurrence signal for any image containing a human (intruder) within the predetermined period (when the number of user decisions input is lower than a predetermined number) after the start of the use of the monitor system 10. After the lapse of the predetermined period (when the number of user decisions input reaches the predetermined number), the event determining unit 103 generates an event occurrence signal only when an image of a human (intruder) is contained in a position designated by the user by operating the OK button 291.

According to the above-described processing, the sensors to be operated can be switched based on user decisions, and the processing by the multi-sensor camera unit 1 can be changed by repeatedly inputting user decisions. Accordingly, only events desired by the user can be detected and reported, and also, sensors and signal processors required only are operated so as to flexibly detect and report events, thereby inhibiting wasteful power consumption. Since the multi-sensor camera unit 1 is driven by the batteries 28, it is preferable that at least one of the feature extracting unit 102, the event determining unit 103, and the control unit 108 be housed in the processing box 2 in order to reduce the power consumption.

The size of the multi-sensor camera unit 1 can also be reduced, and accordingly, it can be easily installed in various places.

The above-described configuration is only an example to implement the monitor system 10. Other system configurations can be considered, and examples thereof are described below.

Sensors used in the monitor system 10 are not restricted to cameras, microphones, and infrared sensors, and may be other types of sensors. Events to be detected are not limited to the above-described examples.

Communication between the multi-sensor camera unit 1 and the processing box 2 does not have to be performed by wireless means, and wired means may be used.

A plurality of multi-sensor camera units 1 may be provided, and a plurality of display devices 3 may be disposed. Although the processing box 2 and the display device 3 are separately provided in the above-described embodiment, they may be integrated into one housing.

The remote controller 4 does not have to be provided with the remote-controller display device 83, and only the display device 3 may be disposed. Instead of displaying events on the remote-controller display device 83, a display device and an input IF for inputting user decisions may be provided in the processing box 2.

The above-described series of processings may be executed by hardware or software. If software is used, the processings are executed by a computer in which a corresponding software program is integrated into dedicated hardware. Alternatively, the corresponding software program is installed from a recording medium into a computer, for example, a general-purpose computer that is able to execute various functions by installing various programs. In this case, the above-described processings are performed by a computer, such as a personal computer 500 shown in FIG. 19.

Figure 19:
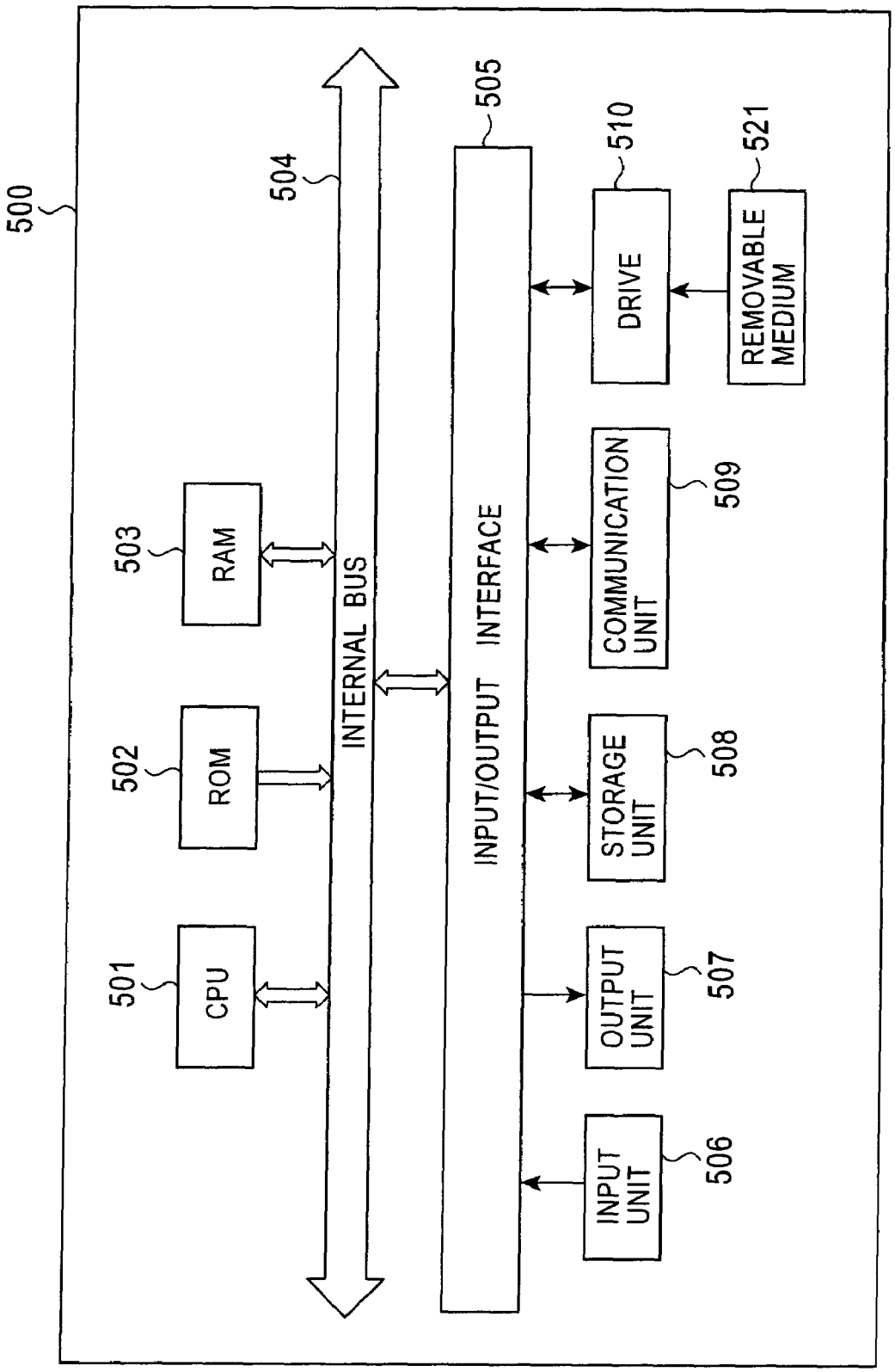
FIG. 19 is a bock diagram illustrating the configuration of a personal computer.

In FIG. 19, a central processing unit (CPU) 501 executes various types of processings according to a program stored in a read only memory (ROM) 502 or a program loaded into a random access memory (RAM) 503 from a storage unit 508. In the RAM 503, data required for performing various types of processings by the CPU 501 are also stored.

The CPU 501, the ROM 502, and the RAM 503 are connected to each other via an internal bus 504. An input/output interface 505 is also connected to the internal bus 504.

The input/output interface 505 is connected to an input unit 506 including a keyboard, a mouse, etc., an output unit 507 including a display device, for example, a cathode ray tube (CRT) display or a liquid crystal display (LCD), and a speaker, the storage unit 508 including a hard disk, and a communication unit 509 including a modem, a terminal adapter, etc. The communication unit 509 performs communication via various networks including telephone lines and cable television.

A drive 510 is connected to the input/output interface 505 if necessary, and a removable medium 521 formed of a magnetic disk, an optical disc, a magneto-optical disk, or a semiconductor memory is loaded in the drive 510. A computer program read from the removable medium 521 is installed into the storage unit 508 according to the necessity.

If software is used, the processings are executed by a computer in which a corresponding software program is integrated into dedicated hardware. Alternatively, the corresponding software program is installed from a recording medium into a computer, for example, a general-purpose computer that is able to execute various functions by installing various programs.

Such a recording medium includes not only a package medium formed of the removable medium 521 recording the program therein, as shown in FIG. 19, which is distributed to the user separately from the computer, but also the ROM 502 or a hard disk contained in the storage unit 508 recording the program therein, which is provided to the user by being integrated into the computer.

Steps of the computer program may be performed in chronological order described in this embodiment, and also may be performed concurrently or individually.

In this embodiment, the system means the overall apparatus consisting of a plurality of devices.

As described above, according to this embodiment, events can be reported, and more particularly, events can be flexibly detected and reported based on the input of user decisions while inhibiting wasteful power consumption.

When no event has occurred, a predetermined signal may be sent to the user, and in case of the occurrence of an event, the corresponding information may be given to the user.

Another embodiment of the present invention is described below.

Figure 20:
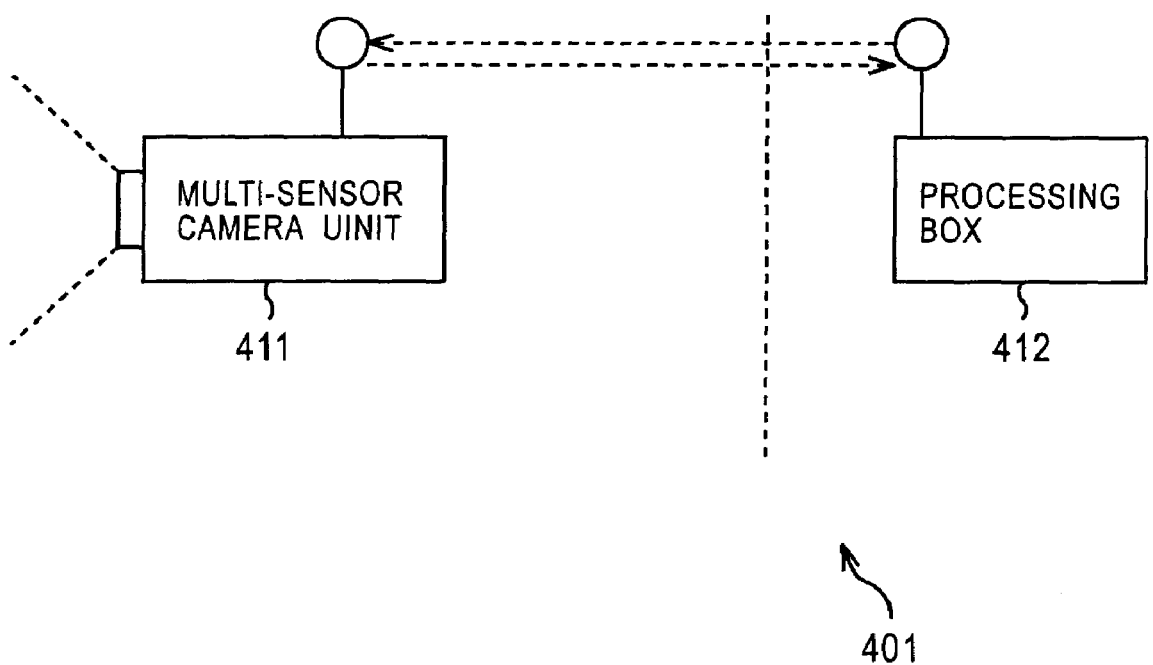
FIG. 20 illustrates the overall configuration of a security system according to another embodiment of the present invention.

FIG. 20 illustrates the overall configuration of a security system 401 according to another embodiment of the present invention.

The security system 401 is formed of a security camera unit 411 and a receiver 412. The security camera unit 411 is installed outdoors (for example, in the porch or in the garden), and the receiver 412 is installed indoors (for example, at the entrance or in the living room). The security camera unit 411 and the receiver 412 can communicate with each other by wireless means, as in the previous embodiment. The security camera unit 411 sends an image signal and an audio signal obtained by a built-in video camera 422 and a built-in microphone 423, which are described below with reference to FIG. 21, to the receiver 412.

The receiver 412 receives the image signal and the audio signal from the security camera unit 411, outputs them to a display device, such as an LCD device, and a speaker, respectively, (neither of them is shown), provided for the receiver 412, and controls the display device and the speaker to display the image signal and to output the audio signal, respectively. The user is then able to check whether there is an intruder outdoors while remaining indoors.

Figure 21:
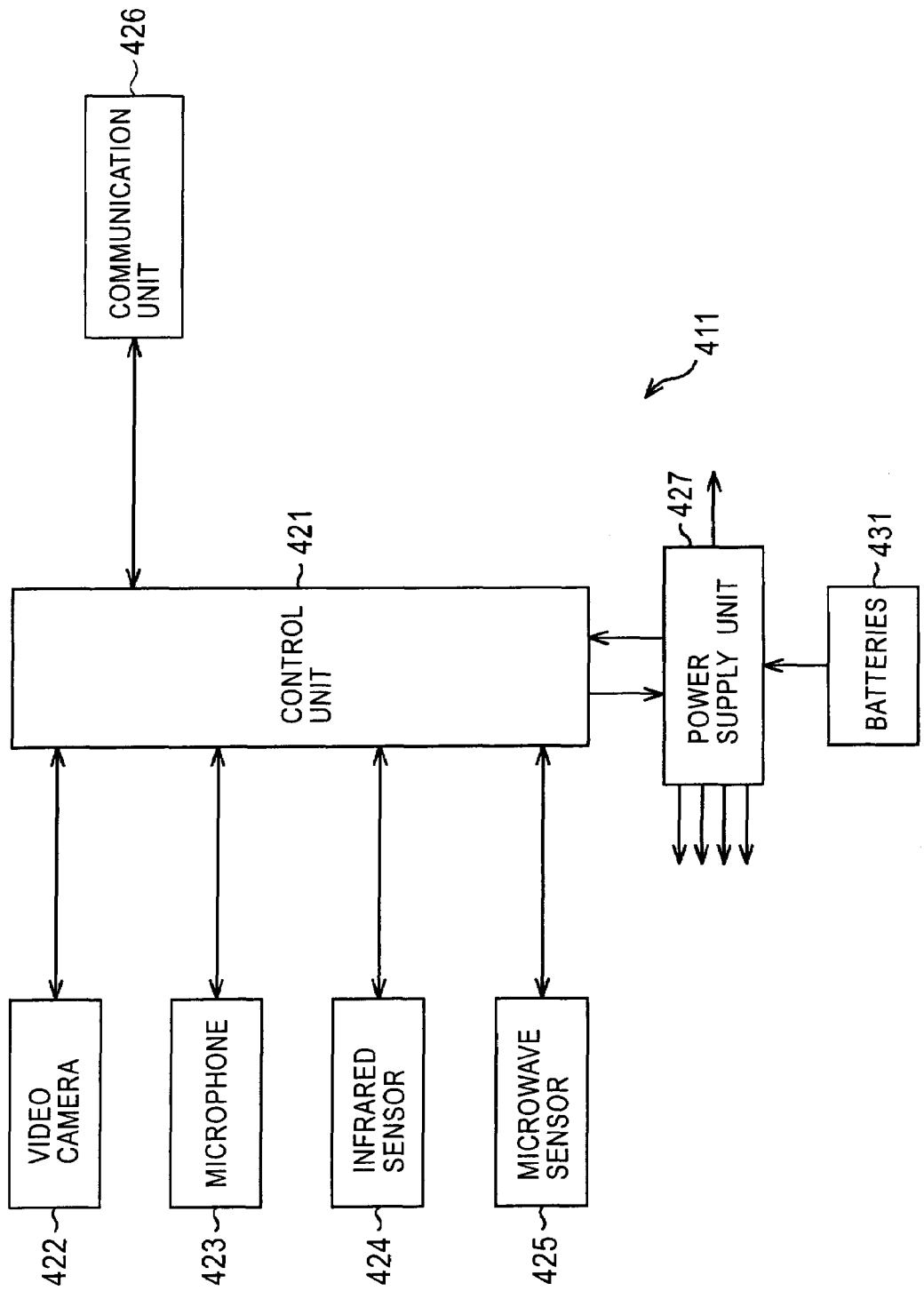
FIG. 21 is a block diagram illustrating the configuration of a security camera unit shown in FIG. 20.

FIG. 21 is a block diagram illustrating the configuration of the security camera unit 411. The security camera unit 411 includes a control unit 421, the video camera (may be a digital camera) 422, the microphone 423, an infrared sensor 424, a microwave sensor 425, a communication unit 426, and a power supply unit 427. Batteries 431 supply power to the individual elements of the security camera unit 411.

The control unit 421 formed of, for example, a microcomputer, controls the operations of the video camera 422, the microphone 423, the infrared sensor 424, the microwave sensor 425, the communication unit 426, and the power supply unit 427. The functional configuration of the control unit 421 is described below with reference to FIG. 22.

The video camera 422 captures images in the photographic area by monitoring the situation outdoors (for example, the situation of a porch or a garden). If an object, such as an intruder, enters the photographic area, the image of such an intruder is captured. The microphone 423 collects sound issued from and near an intruder, for example, an intruder's voice or the sound of intruder's action, and the sound of an object broken by the intruder, and converts the sound into an electric signal so as to supply it to the control unit 421.

The infrared sensor 424 receives light in an infrared area emitted from an object (not shown), and converts the light into an electric signal so as to supply it to the control unit 421. The microwave sensor 425 generates microwaves and detects reflection waves generated when the microwaves are reflected by an object. The microwave signal 425 then generates a detection signal indicating whether the reflection waves lead or lag with respect to a reference phase, and supplies the detection signal to the control unit 421. The phase lead and phase lag are due to the Doppler effect, and correspond to the situations where an object approaches the microwave sensor 425 and an object goes away from the microwave sensor 425.

The communication unit 426 obtains an image signal supplied from the video camera 422 or an audio signal supplied from the microphone 423 based on a communication control signal supplied from the control unit 421, and sends the corresponding signal to a communication device (not shown) of the receiver 412. The power supply unit 427 supplies power from the batteries 431 to the video camera 422, the microphone 423, the infrared sensor 424, the microwave sensor 425, and the communication unit 426 under the control of the control unit 421. The batteries 431 may be primary cells or secondary cells.

The levels of power consumption of the elements of the security camera unit 411 decrease in the following order of: the video camera 422, the microphone 423, the microwave sensor 425, and the infrared sensor 424 in order of decreasing power consumption.

Figure 22:
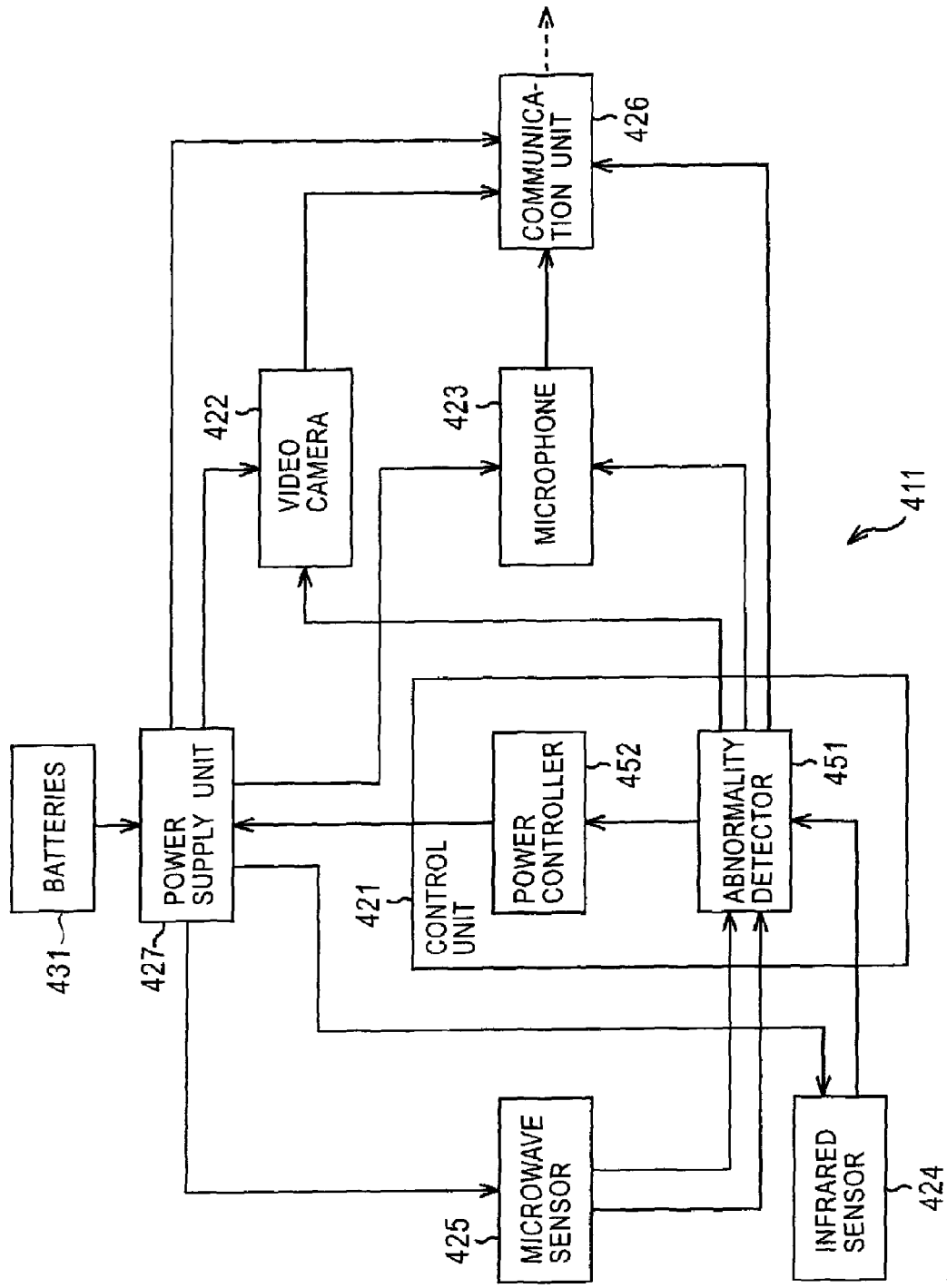
FIG. 22 is a block diagram illustrating the functional configuration of the security camera unit shown in FIG. 20.

FIG. 22 is a block diagram illustrating the functional configuration of the security camera unit 411 shown in FIG. 20. The same elements as those shown in FIG. 21 are indicated by like reference numerals, and an explanation thereof is thus omitted. The control unit 421 includes an abnormality detector 451 and a power controller 452.

The abnormality detector 451 determines whether an abnormality has occurred based on a detection signal supplied from the infrared sensor 424, and also based on a detection signal supplied from the microwave sensor 425. Based on a determination result indicating whether an abnormality has been detected by the infrared sensor 424 or the microwave sensor 425, the abnormality detector 451 generates a microwave-sensor power control signal, a video-camera power control signal, a microphone power control signal, and a communication-unit power control signal as required, and supplies the generated signals to the power controller 452, and also generates a communication control signal to a communication unit 426. The abnormality detector 451 generates an abnormality detection signal, and supplies it to the video camera 422 and the microphone 423.

Based on the microwave-sensor power control signal, the video-camera power control signal, the microphone power control signal, and the communication-unit power control signal supplied from the abnormality detector 451, the power controller 452 controls the power supply unit 427 to supply power to the microwave sensor 425, the video camera 422, the microphone 423, and the communication unit 427 from the batteries 431.

Figure 23:
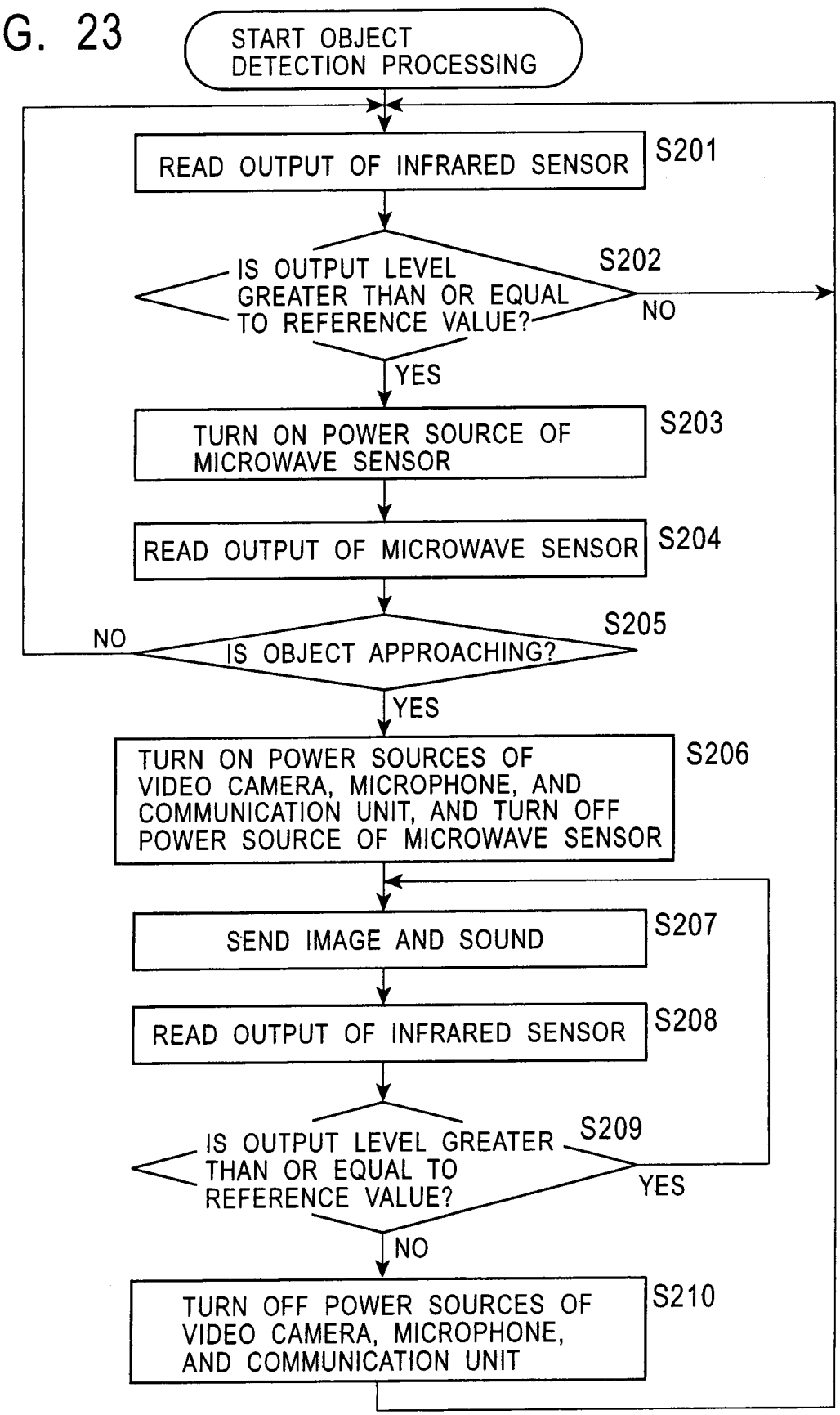
FIG. 23 is a flowchart illustrating object detection processing performed by the security camera unit shown in FIG. 20.

Object detection processing performed by the security camera unit 411 shown in FIG. 20 is described below with reference to the flowchart of FIG. 23.

The infrared sensor 424, which is operable by being constantly supplied with power from the batteries 431 via the power supply unit 427, receives infrared rays emitted from an object including a human (not shown), and outputs a corresponding detection signal.

In step S201, the abnormality detector 451 reads the detection signal. In step S202, the abnormality detector 451 determines whether an abnormality has occurred based on the detection signal supplied from the infrared sensor 424. More specifically, the abnormality detector 451 determines whether the output level of the detection signal from the infrared sensor 451 is greater than or equal to a predetermined reference value. If it is determined in step S202 that the output level of the detection signal is greater than or equal to the predetermined reference value, the abnormality detector 451 determines that an abnormality has occurred. If it is determined that the output level of the detection signal is smaller than the predetermined reference value, the abnormality detector 451 determines that an abnormality has not occurred.

Figure 24:
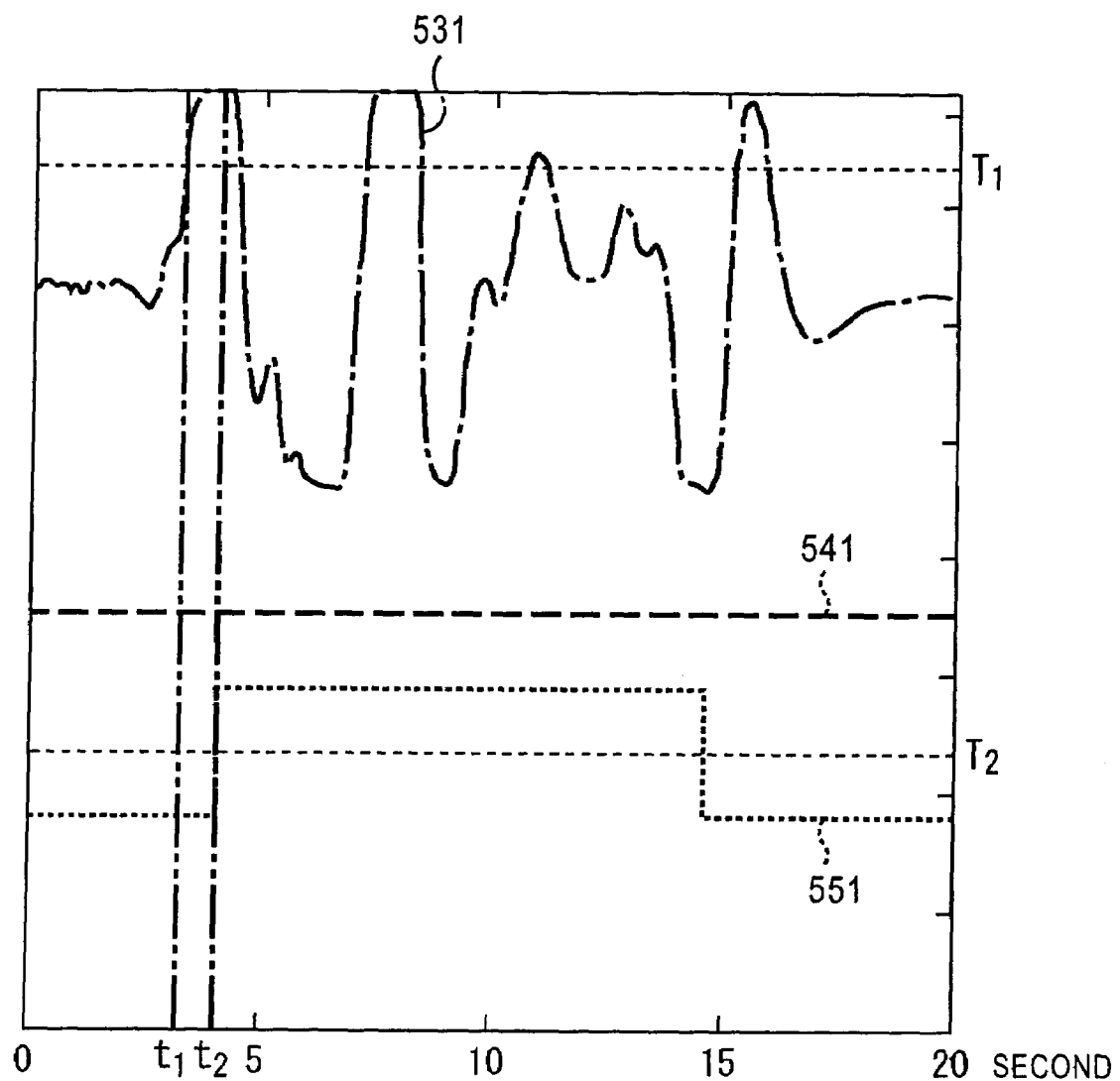
FIGS. 24 and 25 illustrate outputs of an infrared sensor and a microwave sensor shown in FIG. 21.

For example, as shown in FIG. 24, the abnormality detector 451 determines whether the output level of a detection signal 531 from the infrared sensor 424 is greater than or equal to a reference value $T_1$.

If it is determined in step S202 that an abnormality has not occurred, i.e., the output level of the detection signal from the infrared signal 424 is smaller than the reference value $T_1$, the process returns to step S201, and the security camera unit 411 enters the standby mode until the infrared sensor 424 detects an object. Power is not supplied to the microwave sensor 425, the microphone 423, the video camera 422, and the communication unit 426 until the infrared sensor 424 detects an object. Accordingly, the batteries 431 can be prevented from wastefully consuming power, and thus, they can be used over a long period of time.

If it is determined in step S202 that an abnormality has occurred, the abnormality detector 451 generates a microwave-sensor power control signal and supplies it to the power controller 452. Upon receiving a microwave-signal power control signal from the abnormality detector 451, in step S203, the power controller 452 controls the power supply unit 427 to supply power of the batteries 431 to the microwave sensor 425, thereby allowing the microwave sensor 425 to be operable.

The microwave sensor 425 generates microwaves and detects reflection waves generated when the microwaves are reflected by an object. The microwave sensor 425 then generates two detection signals indicating whether the object is approaching the microwave sensor 425 and whether the object is going away from the microwave sensor 425 based on phase changes, and supplies the two signals to the abnormality detector 451. In step S204, the abnormality detector 451 reads the two detection signals from the microwave sensor 425. In step S205, the abnormality detector 451 determines whether an abnormality has occurred based on the two detection signals.

More specifically, the abnormality detector 451 determines whether the output level of the detection signal indicating that the object is approaching the microwave sensor 425 and the output level of the detection signal indicating that the object is going away from the microwave sensor 425 are greater than or equal to a predetermined reference value. If the output level of the detection signal indicating that the object is approaching is found to be greater than or equal to the predetermined reference value, the abnormality detector 451 determines that an abnormality has occurred. If the output level of the detection signal indicating that an object is going away from the infrared sensor 424 is found to be greater than or equal to the predetermined reference value, the abnormality detector 451 determines that an abnormality has not occurred. If the output level of the detection signal indicating that an object is approaching is smaller than the predetermined reference value, or if the output level of the detection signal indicating that an object is going away from the infrared sensor 424 is smaller than the predetermined reference value, the abnormal detector 451 determines that an abnormality has not occurred.

Thus, even if an object has been detected by the infrared sensor 424, it is determined that an abnormality has not occurred if the object is going away from the infrared sensor 424 or is still. That is, the process returns to step S201, and step S201 and the subsequent steps are then repeated. Accordingly, power consumption can be inhibited compared to the case in which the video camera 422 or the microphone 423, which consumes large power, is immediately operated upon detecting an object by the infrared sensor 424.

For example, since the output level of the detection signal 531 from the infrared sensor 424 is smaller than the reference value $T_1$ before time $t_1$, the microwave sensor 425 is not operated. In contrast, at time $t_1$, the output level of the detection signal 531 supplied from the infrared sensor 424 reaches the predetermined reference value $T_1$. Then, the abnormality detector 451 determines that an abnormality has occurred, and generates a microwave-sensor power control signal and supplies it to the power controller 452. The power controller 452 controls the power supply unit 427 to supply power of the batteries 431 to the microwave sensor 425 based on the microwave-sensor power control signal supplied from the abnormality detector 451. Then, the power source of the microwave sensor 425 is switched from OFF to ON, and the microwave sensor 425 starts generating microwaves.

The microwave sensor 425 detects reflection waves generated when microwaves are reflected by an object so as to generate a detection signal 541 indicating that an object is going away from the microwave sensor 425 and a detection signal 551 indicating that an object is approaching the microwave sensor 425, and supplies the detection signals 541 and 551 to the abnormality detector 451. In the example shown in FIG. 24, at time $t_2$, the microwave sensor 245 outputs the detection signal 551 indicating that an object is approaching. The abnormality detector 451 determines that an object is approaching the microwave sensor 425 when the output level of the detection signal 551 is greater than or equal to a predetermined reference value $T_2$.

As stated above, the detection signal 541 is a signal indicating that an object is going away from the microwave sensor 425. Since an object is approaching the microwave sensor 425, the output level of the detection signal 541 remains 0.

Figure 25:
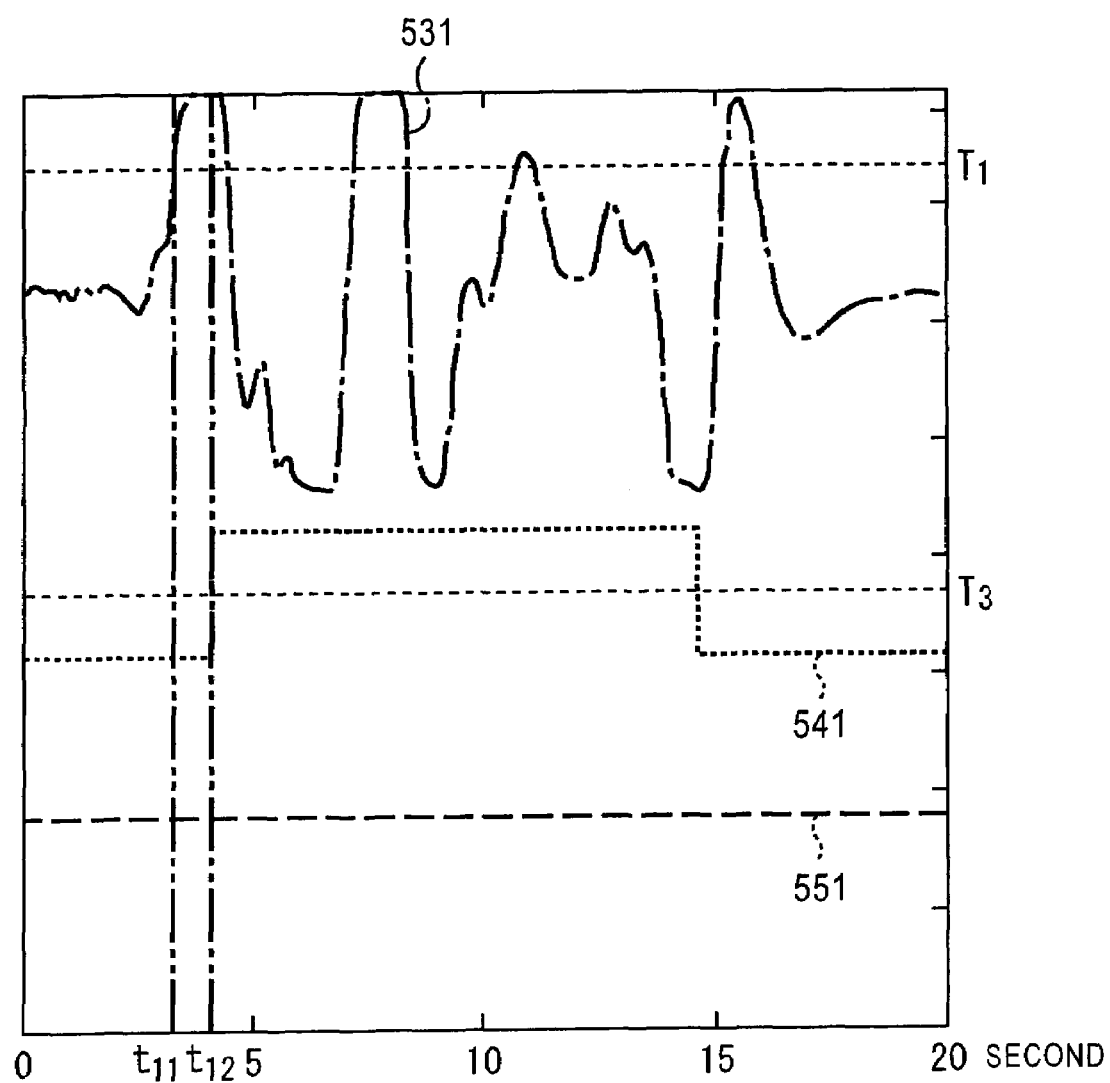

In the example shown in FIG. 25, at time $t_{11}$, the output level of the detection signal 531 from the infrared sensor 424 reaches the predetermined reference value $T_1$, and thus, power is supplied to the microwave sensor 425. At time $t_{12}$, the detection signal 541 indicating that an object is going away from the microwave sensor 425 is output. The abnormality detector 451 determines that no abnormality has occurred when the output level of the detection signal 541 is greater than or equal to a reference value $T_3$.

In the example shown in FIG. 25, since an object is going away from the microwave sensor 425, the output level of the detection signal 551 indicating that an object is approaching the microwave sensor 425 remains 0.

As described above, after detecting an object by the infrared sensor 424, the microwave sensor 425 further determines whether the object is approaching the security camera unit 411. Thus, abnormalities can be detected more precisely, for example, even if an object has been detected, it can be determined that no abnormality has occurred if the object is going away from the security camera unit 411.

If it is determined in step S205 that an abnormality has occurred (an object is approaching), the process proceeds to step S206. In step S206, the abnormality detector 451 generates a microwave-sensor power control signal, a video-camera power control signal, a microphone power control signal, and a communication-unit power control signal, and supplies them to the power controller 452.

In this embodiment, both the power sources of the video camera 422 and the microphone 423 are turned ON. However, only the power source of the video camera 422 or only the power source of the microphone 423 may be turned ON.

In step S206, based on the microwave-sensor power control signal, the video-camera power control signal, the microphone power control signal, and the communication-unit power control signal supplied from the abnormality detector 451, the power controller 452 controls the power supply unit 427 to supply power of the batteries 431 to the video camera 422, the microphone 423, and the communication unit 426, and also to stop supplying power to the microwave sensor 425. Then, the power sources of the video camera 422, the microphone 423, and the communication unit 426 are switched from OFF to ON, and the power source of the microwave sensor 425 is changed from ON to OFF. The video camera 422 is then able to capture images of objects, and the microphone 423 is able to collect sound of and near an intruder outdoors, and the images and sound are converted into electric signals. The communication unit 426 is able to send outputs of the video camera 422 and the microphone 423.

In this manner, power is supplied to the video camera 422 and the microphone 423, which consume large power, only when the microwave sensor 425 detects that an object is approaching, thereby decreasing power consumption in the security camera unit 411.

In step S207, the video camera 422 captures an image of an object in the photographic area, and supplies a corresponding image signal to the communication unit 426. The microphone 423 also collects sound in the sound collecting area, converts it into an electric signal, and supplies a resulting audio signal to the communication unit 426. The communication unit 426 then sends the image signal and the audio signal supplied from the video camera 422 and the microphone 423, respectively, to the receiver 412 based on the communication control signal supplied from the abnormality detector 451.

The infrared sensor 424, which is operable by constantly being supplied with power from the batteries 431 via the power supply unit 427, further receives light from an object including a human (not shown), and outputs a corresponding detection signal. In step S208, the abnormality detector 451 reads the detection signal. In step S209, the abnormality detector 451 determines whether an abnormality has been detected based on the detection signal from the infrared sensor 424. That is, the abnormality detector 451 determines whether the output level of the detection signal is greater than or equal to the predetermined reference value, as in step S202.

Thus, after transmitting the image signal and the audio signal from the communication unit 426, the infrared sensor 424 further detects whether an object is present. Accordingly, it is possible to more precisely detect abnormalities, and also, the user is able to easily determine whether the situation is abnormal.

If it is determined in step S209 that an abnormality has been detected, i.e., the output level of the detection signal from the infrared sensor 424 is greater than or equal to the predetermined reference value, the process returns to step S207, and steps S207 and S208 are then repeated. Accordingly, processing similar to the above-described processing is repeated until abnormalities are eliminated, and thus, the user is able to easily determine whether abnormalities have been eliminated.

If it is determined in step S209 that no abnormality has occurred, i.e., the output level of the detection signal from the infrared sensor 424 is smaller than the predetermined reference value, the abnormality detector 451 generates a video-camera power control signal, a microphone power control signal, and a communication-unit power control signal, and supplies them to the power controller 452. In step S210, the power controller 452 controls the power supply unit 427 to stop supplying power to the video camera 422, the microphone 423, and the communication unit 426 based on the video-camera power control signal, the microphone power control signal, and the communication-unit power control signal, respectively, supplied from the abnormality detector 451. Accordingly, the power sources of the video camera 422, the microphone 423, and the communication unit 426 are changed from ON to OFF. In this manner, power can be supplied to the video camera 422, the microphone 423, and the communication unit 426 only when necessary, thereby enhancing lower power consumption.

In this embodiment, three sensors, i.e., the infrared sensor 424, the microwave sensor 425, and at least one of the video camera 422 and the microphone 423 (which can be considered to be types of sensors) are used for detecting objects. However, other types of sensors may be used.

In this embodiment, the power sources are progressively switched from OFF to ON in order of increasing power consumption, i.e., in the order of the infrared sensor 424, the microwave sensor 425, the microphone 423, and the video camera 422. If other types of sensors are used, as described above, the power sources are switched from OFF to ON in order of increasing power consumption.

According to the above-described embodiment, abnormalities can be detected, and more particularly, abnormalities can be detected more precisely while inhibiting power consumption so that batteries can be used over a long period of time.

An embodiment in which an image-capturing device, such as a security camera, is installed in a vehicle, is described below.

Figure 26:
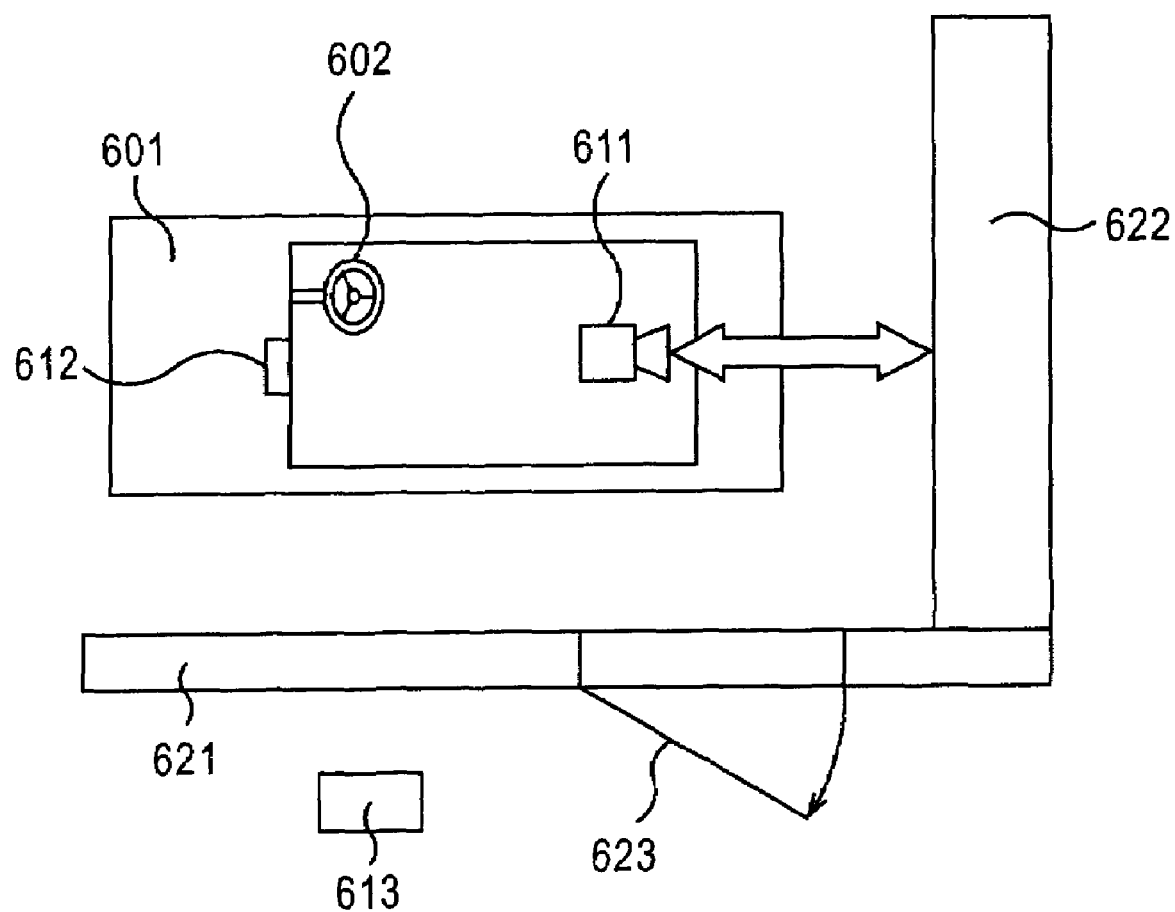
FIG. 26 illustrates an image-capturing device in a back monitor mode according to still another embodiment of the present invention.

Reference is first made to FIG. 26. As shown in FIG. 26, a driver reverses a vehicle 601 into a garage, which is surrounded by a house wall 621 and a wall 622, toward the wall 622 in parallel with the house wall 621. An image-capturing device 611 is installed in the back of the vehicle 601 so that the image-capturing direction faces a desired direction. An image captured by the image-capturing device 611 is sent to a reception display device 612 disposed at the front of the vehicle 601 and at the left side (passenger seat) of a steering wheel 602, and is displayed on the reception display device 612. The driver is then able to understand the distance to the wall 622 or identify an obstacle between the vehicle 601 and the wall 622 by checking the image displayed on the reception display device 612 without turning back. This enables the driver to park the vehicle 601 in the garage safely and speedily. Another reception display device 613 is disposed indoors near a door 623 (outside the vehicle 601) at the house wall 621.

Figure 27:
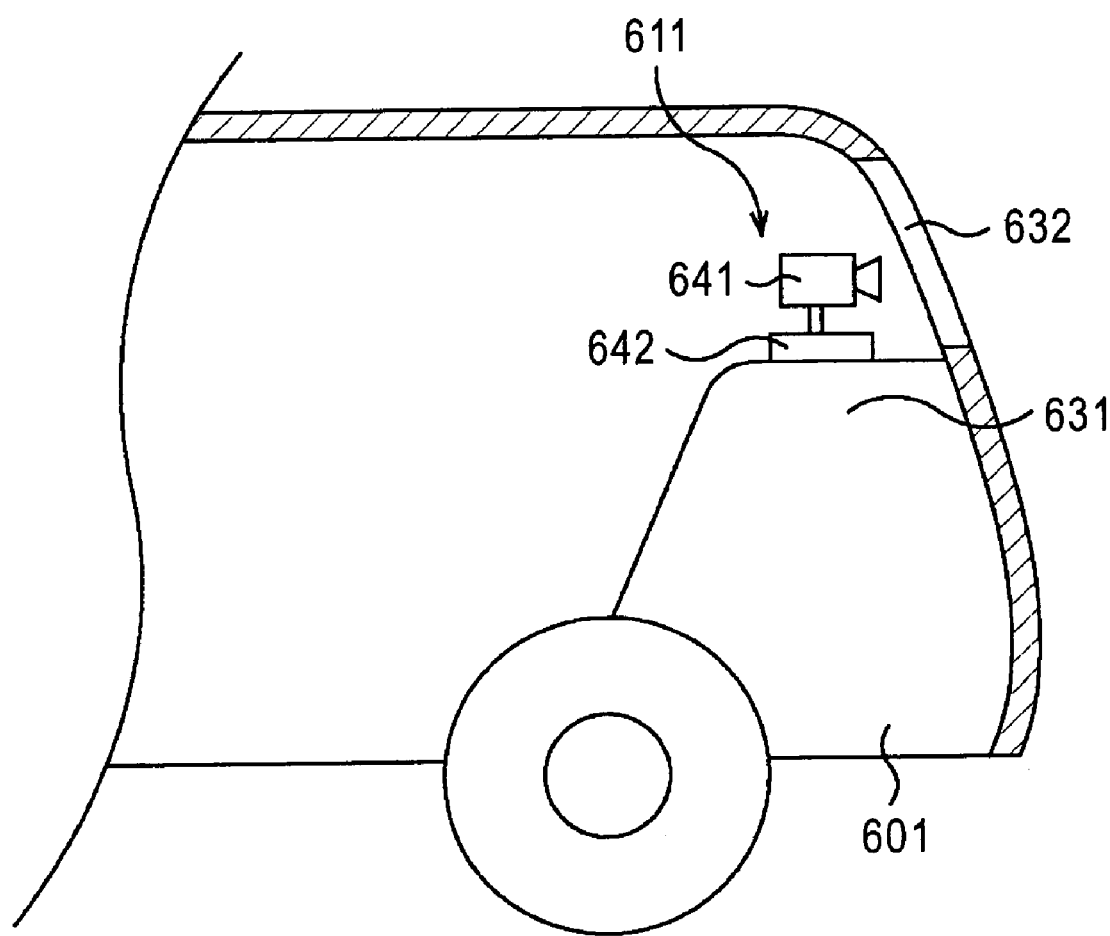
FIG. 27 illustrates an example of the installment of the image-capturing device shown in FIG. 26.

An example of the installment of the image-capturing device 611 is discussed below with reference to FIG. 27.

The image-capturing device 611 is disposed on a backseat 631 of the vehicle 601 from which images outside can be captured through a rear window 632. The image-capturing device 611 is formed of a multi-sensor camera unit 641 and a pan tilter 642, and the multi-sensor camera unit 641 is rotatably loaded on the pan tilter 642 installed on the backseat 631.

The electrical configuration of the image-capturing device 611 is described below with reference to FIG. 28.

A trigger sensor 682 is formed of, for example, a microwave sensor, and detects the presence or the absence of humans (objects), the distance, and the moving direction. A detection signal obtained by the trigger sensor 682 is sent to a microcomputer 676. Generally, glass does not transmit infrared rays of infrared sensors. Accordingly, infrared sensors cannot detect the motion through the windows of the vehicle 601, and thus, they are not used in this example. However, the trigger sensor 682 does not restricted to a microwave sensor, and may be another type of sensor, for example, a thermal sensor, a vibration sensor, or an acoustic sensor.

An input unit 681 includes a switch, a button, etc. (not shown). By operating the input unit 681, the user is able to store a threshold for determining the occurrence of an abnormality from a detection signal sent from the trigger sensor 682 in a memory 677 built in the microcomputer 676.

Upon receiving a detection signal from the trigger sensor 682, the microcomputer 676 compares the detection signal with the threshold stored in the memory 677. When the detection signal is found to be greater than or equal to the threshold, the microcomputer 676 controls a power control relay 675 to supply power to a video camera 671, a processor 672, and a wireless communication unit 673 from a selector 679, thereby operating these elements. When the detection signal is smaller than the threshold, the video camera 671, the processor 672, and the wireless communication unit 673 are not operated so that power consumption can be suppressed. In particular, the video camera 671, which consumes relatively large power, is not operated, which is effective in suppressing power consumption.

A video signal obtained by the video camera 671 is supplied to the processor 672, and is combined with distance information and battery remaining-amount information supplied from the microcomputer 676 as required. The video signal combined with the distance information and the battery remaining-amount information is further subjected to various types of signal processing in the processor 672, and is then supplied to the wireless communication unit 673. The video signal is then wirelessly transmitted from the wireless communication unit 673 to the reception display devices 612 and 613 via an antenna 674.

The distance information includes, for example, a message corresponding to the distance to an obstacle, for example, "about one more meter", and is stored in the memory 677.

A battery unit 678 disposed in the multi-sensor camera unit 611 or a vehicle battery unit 702 disposed in the vehicle 601 supplies power to the video camera 671, the processor 672, the wireless communication unit 673, the trigger sensor 682, the microcomputer 676, and a driving unit 680. Normally, power is supplied from the battery unit 678, and when the remaining amount of the battery unit 678 is smaller than a first reference value, power is supplied from the vehicle battery unit 702.

The battery unit 678 and the vehicle battery unit 702 are switched by the selector 679. The microcomputer 676 determines whether the remaining amount of the battery unit 678 is smaller than the first reference value stored in the built-in memory 677. When the remaining amount of the battery unit 678 is smaller than the first reference value, the microcomputer 676 controls the selector 679 to select the vehicle battery unit 702 and controls the vehicle battery unit 702 to supply power to the individual elements.

The microcomputer 676 also determines whether the remaining amount of the vehicle battery unit 702 is smaller than a second reference value (which is smaller than the first reference value) stored in the memory 677. When the remaining amount of the vehicle battery unit 702 is found to be smaller than the second reference value, the microcomputer 676 outputs battery remaining-amount information to the processor 672. The battery remaining-amount information is combined with the video signal from the video camera 671 as required, and is sent to the reception display devices 612 and 613. Accordingly, the user is able to know that the remaining amount of the batteries becomes small.

A status detector 701 disposed in the vehicle 601 detects the operation status of the vehicle 601, and outputs a status detection signal corresponding to the detection result to the microcomputer 676. The microcomputer 676 controls the drive unit 680 to rotate the pan tilter 642 at a predetermined position based on the input status detection signal. The position at which the pan tilter 642 rotates can be prestored in the memory 677 by the operating the input unit 681 by the user.

A removable medium 691 formed of a magnetic disk, an optical disc, a magneto-optical disk, or a semiconductor memory is loaded in the microcomputer 676 as required.

Figure 29:
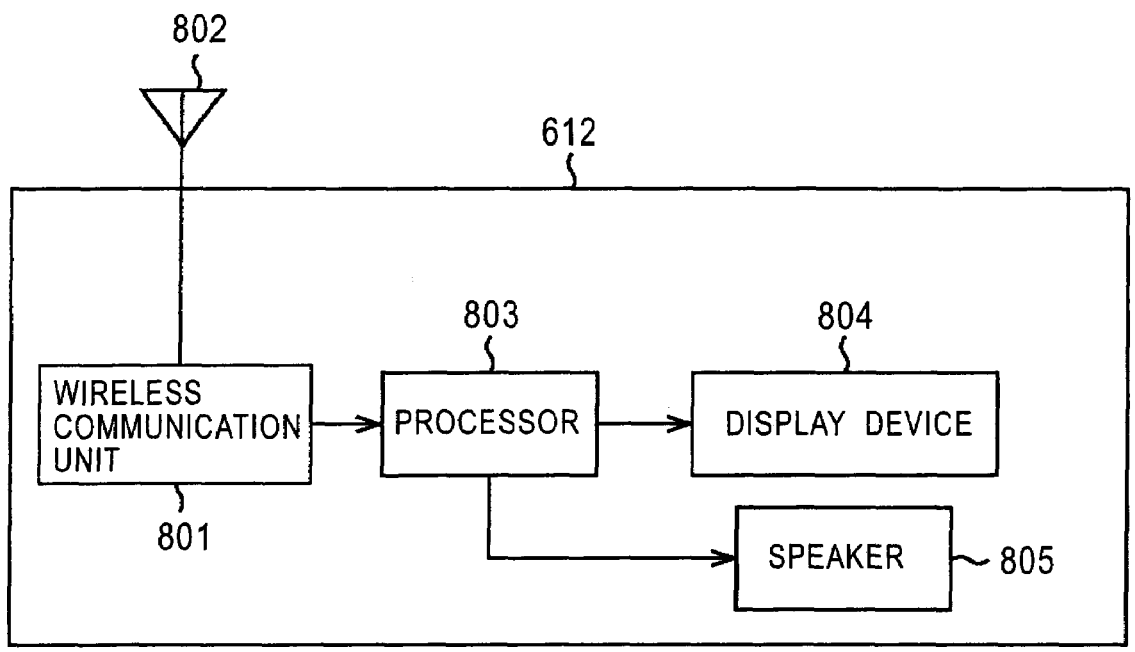
FIG. 29 is a block diagram illustrating the electrical configuration of a reception display device disposed inside the vehicle shown in FIG. 26.

FIG. 29 illustrates the electrical configuration of the reception display device 612.

A wireless communication unit 801 receives a video image obtained by the video camera 671, the distance information obtained by the trigger sensor 682, and the battery remaining-amount information from the wireless communication unit 673 of the image-capturing device 611 via an antenna 802.

The video signal, the distance information, the battery remaining-amount information received by the wireless communication unit 801 are supplied to a processor 803. The processor 803 separates the video signal from the input signal, and outputs the video signal to a display device 804, for example, an LCD device. The display device 804 then displays an image corresponding to the video signal. The processor 803 also separates the battery remaining-amount information from the input signal, and supplies it to the display device 804. The display device 804 then displays the battery remaining-amount information, for example, a battery run-out message. The processor 803 also separates the distance information from the input signal, and supplies it to a speaker 805. Then, an audio message, for example, "about one more meter", is output from the speaker 805. The sound to be output is not restricted to the above-described example.

Communication between the image-capturing device 611 and the reception display device 612 are wirelessly performed. However, since both elements are disposed in the vehicle 601, communication therebetween may be performed by wired means. The display device of a car navigation system or a car television receiver may also be used as the display device 804. Alternatively, the reception display device 612 may also be used as a car navigation system or a car television receiver.

Figure 30:
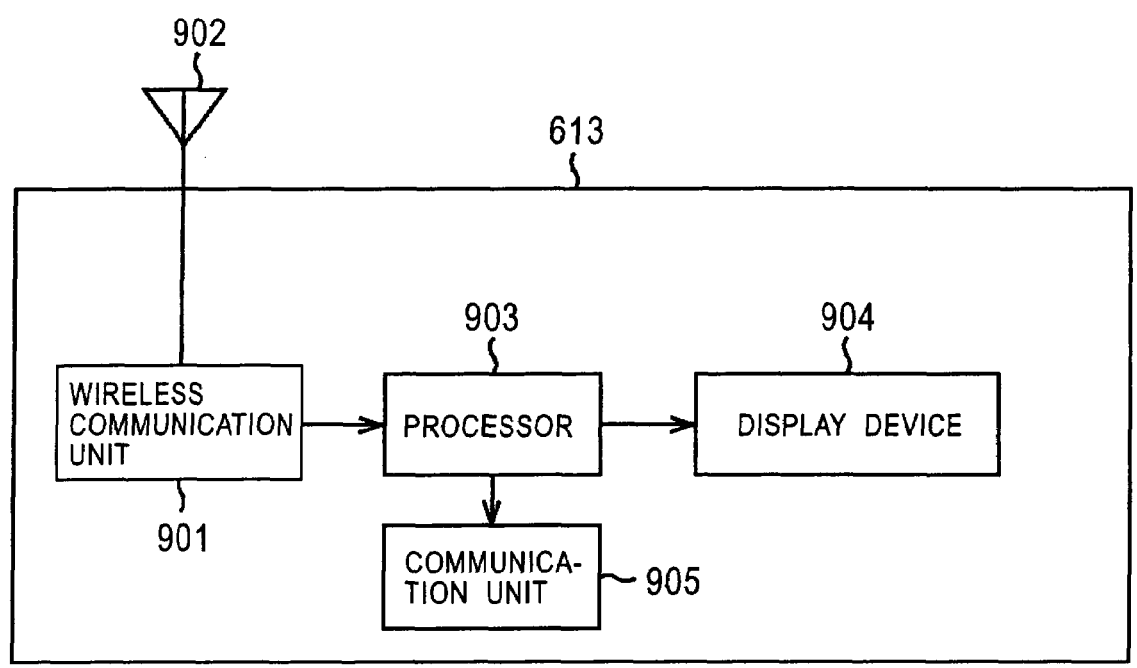
FIG. 30 is a block diagram illustrating the electrical configuration of a reception display device disposed outside the vehicle shown in FIG. 26.

The electrical configuration of the reception display device 613 is discussed below with reference to FIG. 30.

The video signal and the battery remaining-amount information received by a wireless communication unit 901 via an antenna 902 are supplied to a processor 903. The processor 903 separates the video signal from the input signal, and supplies it to a display device 904. The display device 904 then displays an image corresponding to the video signal. The processor 903 separates the battery remaining-amount information form the input signal, and outputs it to the display device 904. The display device 904 then displays the battery remaining-amount information, for example, a battery runout message.

The processor 903 also sends the received video signal and the battery remaining-amount information to a user's mobile terminal via a communication unit 905. Accordingly, the user is able to view the received video signal and to recognize that the batteries are running out even if the user is not near the reception display device 613 disposed indoors.

Since the image-capturing device 611 is disposed inside the vehicle 601, and the reception display device 613 is disposed indoors (outside the vehicle 601), communication between the two elements is performed by wireless means. The display device of a television receiver or an interphone disposed indoors may also be used as the display device 904.

The image-capturing device 611 is used not only for a back monitor for reversing the vehicle 601, but also for a monitor for households. Accordingly, the user is required to register the monitoring direction in advance before starting to use the image-capturing device 611.

Figure 31:
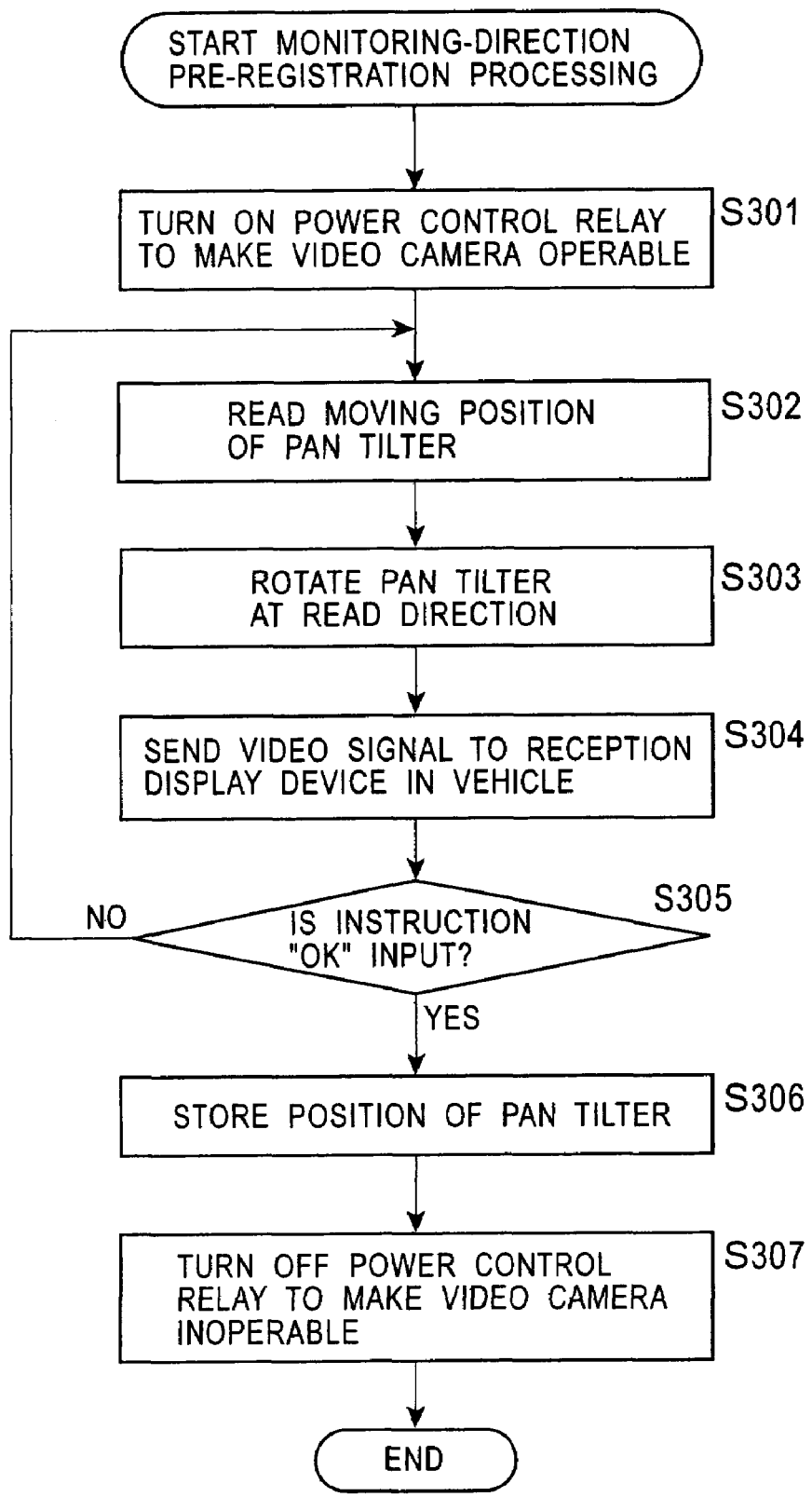
FIG. 31 is a flowchart illustrating monitoring-direction pre-registration processing.

A description is now given of pre-registration processing for the monitoring direction with reference to the flowchart of FIG. 31. This processing is performed while the user parks the vehicle 601 at a normal position in the garage.

The user inputs an instruction to set the monitoring direction through the input unit 681. Then, in step S301, the microcomputer 676 turns ON the power control relay 675 to supply power output from the battery unit 678 via the selector 679 to the video camera 671, the processor 672, and the wireless communication unit 673, thereby operating these elements.

The user then inputs a moving position by operating the input unit 681 so that the video camera 671 faces the monitoring direction. In step S302, the microcomputer 676 reads the designated position of the pan tilter 642.

In step S303, the microcomputer 676 controls the drive unit 680 to rotate the pan tilter 642 at the position read in step S302. In the example shown in FIG. 32, the pan tilter 642 is rotated so that the photographic direction of the video camera 671 is set so that the video camera 671 captures images of the house wall 621.

In step S304, the microcomputer 676 controls the wireless communication unit 673 to transmit the video signal obtained (captured) by the video camera 671 to the reception display device 612. The processor 803 of the reception display device 612 outputs the video signal received by the wireless communication unit 801 via the antenna 802 to the display device 804, and the video signal is displayed on the display device 804. Since the video signal is transmitted to the reception display device 612 installed in the vehicle 601, the user is able to immediately check the image displayed on the display device 804 of the reception display device 612.

The user continues to operate the input unit 681 until the image in a desired monitoring direction is displayed by checking the screen of the display device 804. When the image in the desired monitoring direction is displayed, the user inputs an instruction "OK" by operating the input unit 681. Then, in step S305, the microcomputer 676 determines whether an instruction "OK" is input through the input unit 681.

If it is found in step S305 that an instruction "OK" is not input by the user through the input unit 681, i.e., if the image displayed on the reception display device 612 does not coincide with the image within the monitoring area desired by the user in step S304, the process returns to step S302, and the position of the pan tilter 642 is moved.

Figure 32:
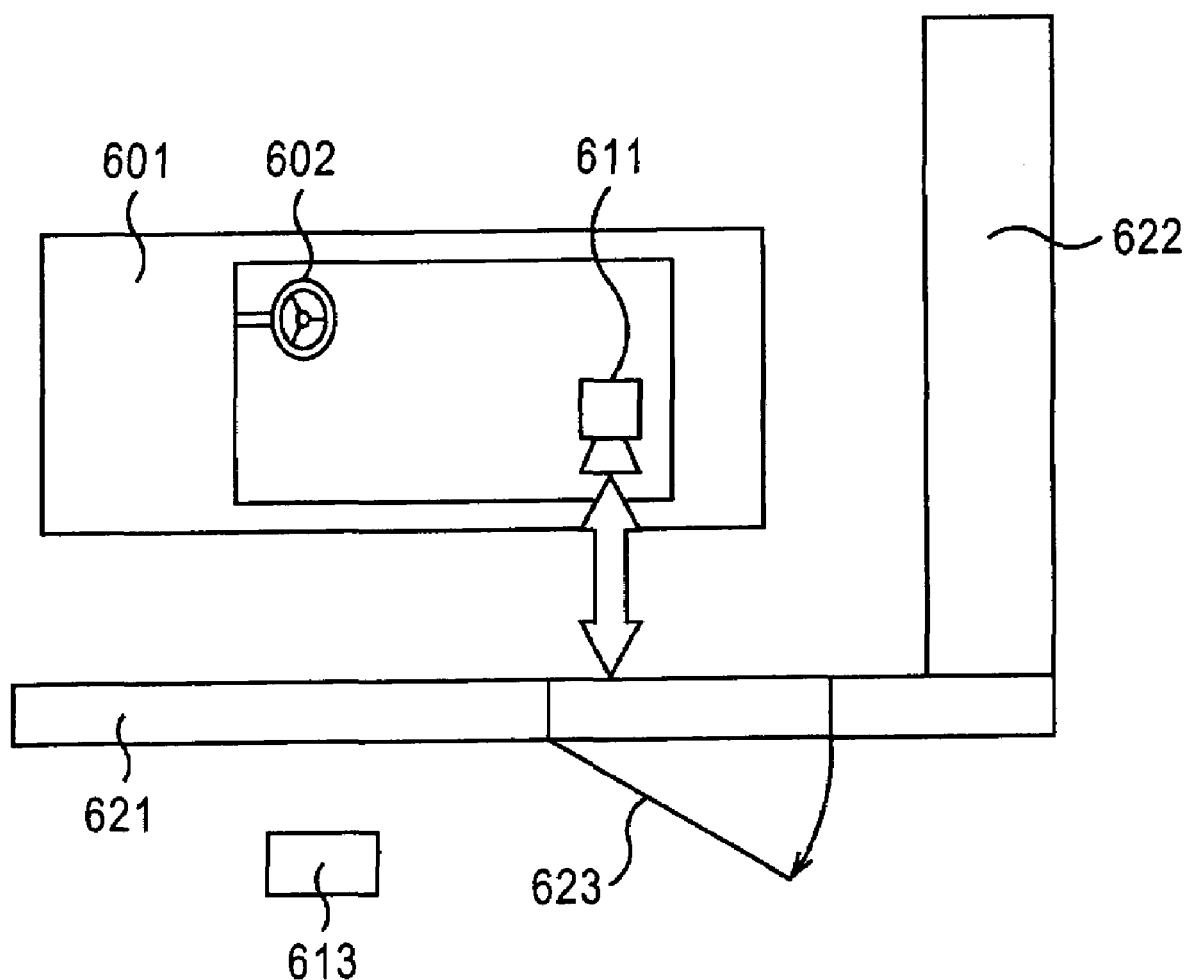
FIG. 32 illustrates the image-capturing device shown in FIG. 26 in a monitor mode.

For example, when the video camera 671 captures an image of the door 623, as shown in FIG. 32, the user operates the input unit 681 to input an instruction "OK".

If it is determined in step S305 that an instruction "OK" is input by the user through the input unit 681, i.e., if the image displayed on the reception display device 612 substantially coincides with the image in the monitoring area desired by the user in step S304, the process proceeds to step S306. In step S306, the microcomputer 676 stores the position of the pan tilter 642 in the built-in memory 677.

In step S307, the microcomputer 676 turns OFF the power control relay 675 to stop supplying power to the video camera 671, the processor 672, and the wireless communication unit 673, thereby rendering these elements inoperable. Then, the monitoring-direction pre-registration processing is completed. This processing is performed only once unless the monitoring direction is changed.

Sensor processing performed by the microcomputer 676 is described below with reference to FIG. 33.

In step S310, the microcomputer 676 receives a status detection signal from the status detector 701 disposed in the vehicle 601, and determines whether the engine key of the vehicle 601 has been removed based on the received status detection signal.

If it is determined in step S310 that the engine key has been removed, i.e., when the vehicle 601 is parked, in step S313, the microcomputer 676 performs monitor mode processing. Details of the monitor mode processing are given below with reference to FIG. 35. In this manner, when the engine key is removed, the vehicle 601 automatically enters the monitor mode without requiring a special operation for setting the monitor mode. As a result, the situation in which the user forgets to set the monitor mode can be prevented, and monitoring can be reliably performed.

If it is determined in step S310 that the engine key has not been removed, the process proceeds to step S311. In step S311, the microcomputer 676 determines whether the transmission gear is at the back position (the position at which the vehicle 601 is reversed) based on the status detection signal received in step S310.

If it is found in step S311 that the transmission gear is at the back position, in step S312, the microcomputer 676 performs back monitor processing. Details of the back monitor processing are given below with reference to FIG. 34.

If it is found in step S311 that the transmission gear is not at the back position, that is, when the vehicle 601 is still or advances, or after step S312 or S313, the process returns to step S310, and step S310 and the subsequent steps are then repeated.

Figure 34:
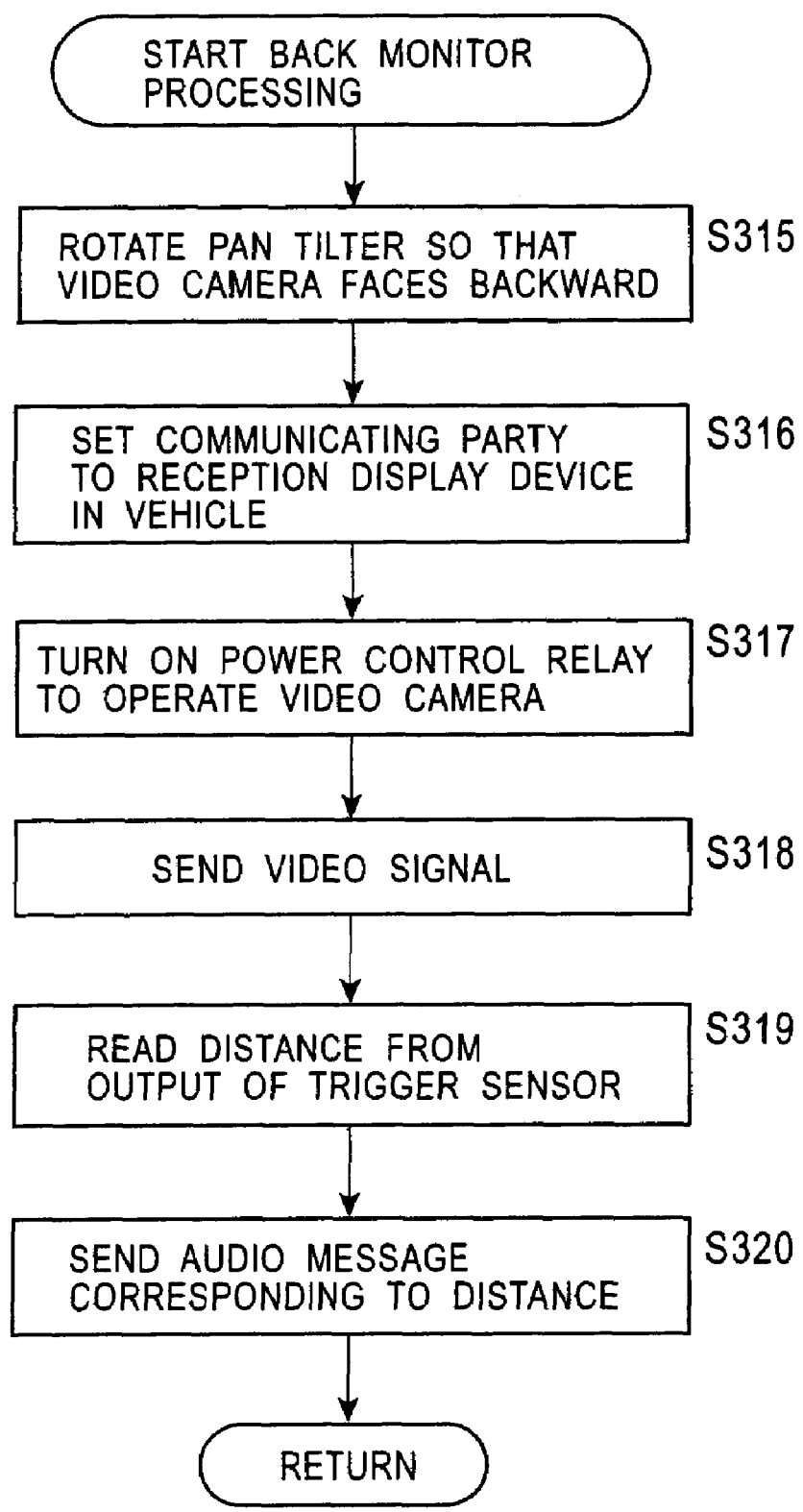
FIG. 34 is a flowchart illustrating back monitor processing.

Back monitor processing is described below with reference to FIG. 34.

Back monitor processing is performed when the transmission gear is at the back position, namely, when the vehicle 601 is reversed, for example, into the garage.

In step S315, the microcomputer 676 controls the drive unit 680 to drive the pan tilter 642 so that the video camera 671 can capture images at the back of the vehicle 601 through the window 632.

In step S316, the microcomputer 676 sets the communicating party to be the reception display device 612 disposed in the vehicle 601 rather than the reception display device 613 disposed outside the vehicle 601.

In step S317, the microcomputer 676 turns ON the power control relay 675, and also controls the selector 679 to select power from the battery unit 678 so as to supply power to the video camera unit 671, the processor 672, and the wireless communication unit 673, thereby operating these elements.

If the settings in steps S315, S316, and S317 have already been made before the processing, these steps are ignored.

In step S318, the microcomputer 676 transmits a video signal obtained by the video camera 671 and subjected to various types of signal processing by the processor 672 to the reception display device 612 via the antenna 674 from the wireless communication unit 673.

In step S319, the microcomputer 676 reads distance information obtained by the distance sensor of the trigger sensor 682.

In step S320, the microcomputer 676 reads an audio message corresponding to the distance information read in step S319 from the memory 677, and sends the audio message to the reception display device 612.

Figure 33:
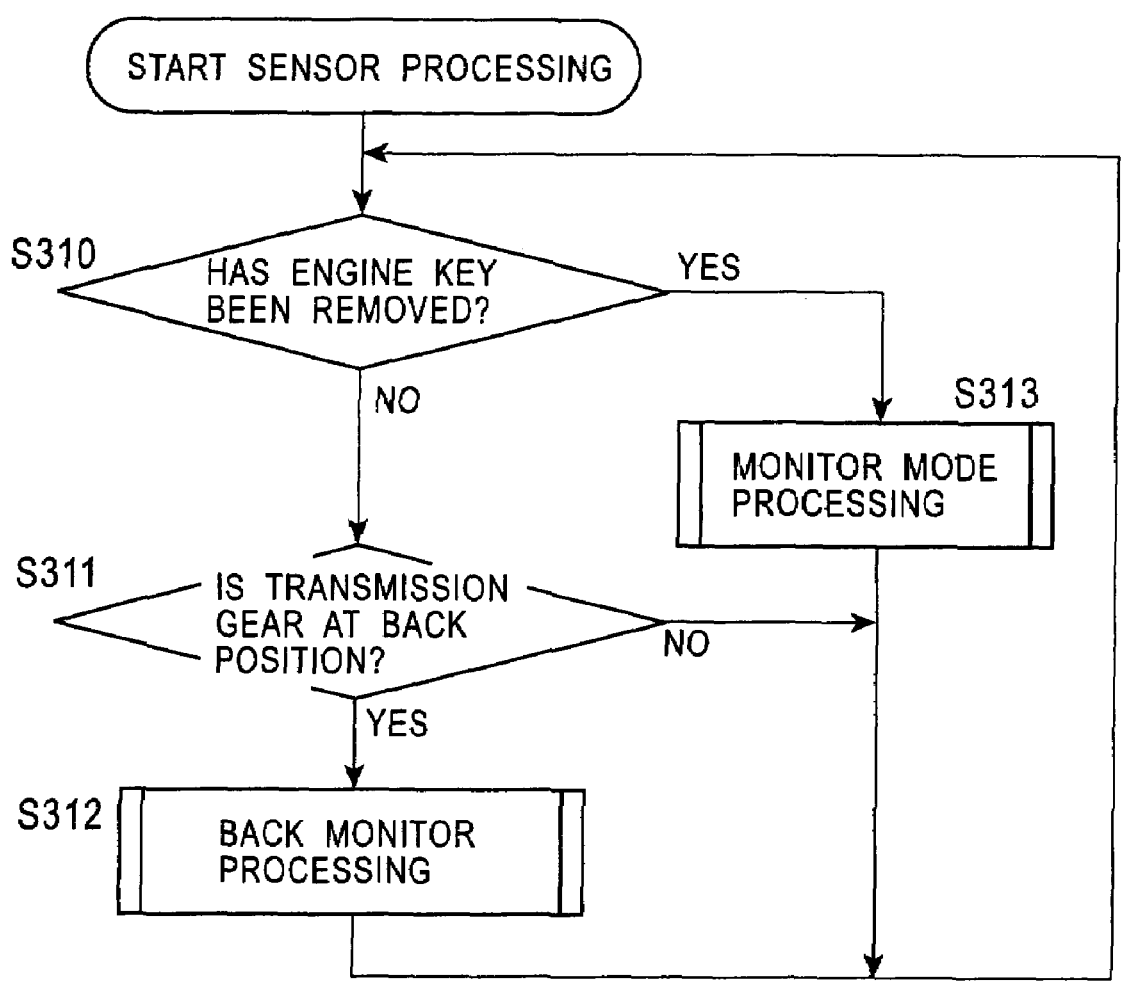
FIG. 33 is a flowchart illustrating sensor processing.

The above-described processing is repeatedly performed in the route of steps S310, S311, and S312 of FIG. 33. The processor 803 of the reception display device 612 processes the signal received by the wireless communication unit 801 from the wireless communication unit 673 via the antenna 802, and outputs the video signal to the display device 804 and outputs the audio signal as the distance information to the speaker 805. Accordingly, an image in the back of the vehicle 801 is displayed on the display device 804, and an alarm message corresponding to the distance information, for example, "three more meters", "two more meters", or "one more meter", is issued from the speaker 805. The user (driver) is thus able to reverse the vehicle 601 safely and comfortably by checking the display device 804 in front without turning back.

The audio message corresponding to the distance information may be stored in a storage unit (not shown) of the reception display device 612 rather than storing in the memory 677 of the microcomputer 676, and when the reception display device 612 receives the distance information, the audio message may be read from the storage unit.

Figure 35:
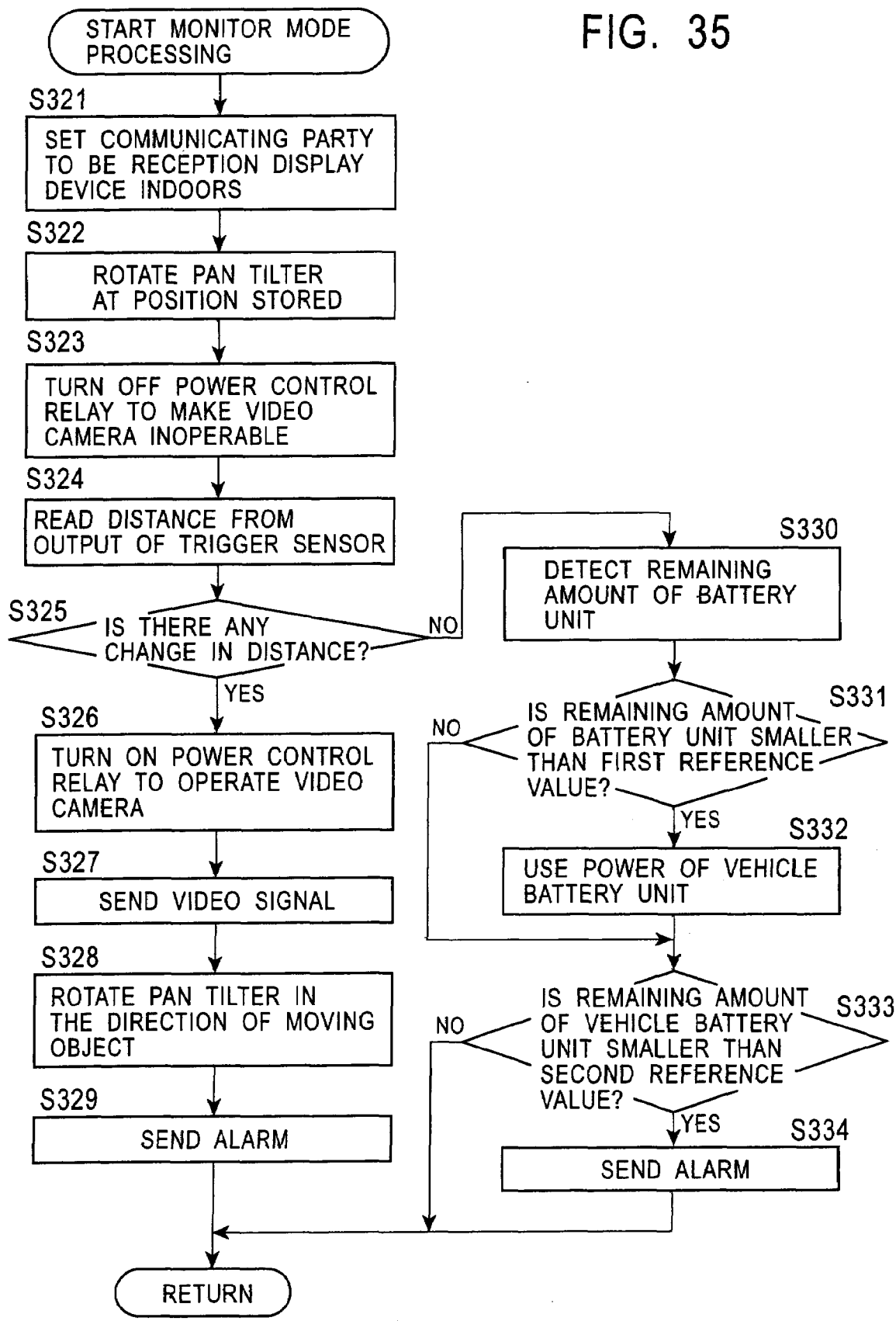
FIG. 35 is a flowchart illustrating monitor mode processing.

Details of the monitor mode processing in step S313 of FIG. 33 are described below with reference to FIG. 35.

As discussed above, this processing is automatically performed when the engine key of the vehicle 601 has been removed (when the vehicle 601 is parked).

In step S321, the microcomputer 676 sets the communicating party to be the reception display device 613 disposed indoors rather than the reception display device 612 inside the vehicle 601.

In step S322, the microcomputer 676 drives the drive unit 680 to rotate the pan tilter 642 at the position stored in the memory 677 (position stored in step S306 of FIG. 31). The monitor direction in the monitor mode may be set by operating the input unit 681 by the user. In this case, however, the user is required to set the direction, for example, every time the user parks the vehicle 601. Accordingly, if the position of the pan tilter 642 is registered in advance, the direction is automatically set by parking the vehicle 601 at the predetermined position (by removing the engine key). Thus, the ease of operation can be enhanced, and also, the situation in which the user forgets to set the direction can be eliminated, thereby allowing the monitoring processing to be reliably performed.

In this manner, the monitored area set by the user (an area other than the vehicle 601) is monitored by the video camera 671 provided for the vehicle 601, thereby decreasing the possibility an intruder realizing that he/she is monitored, and also making it possible to reliably monitor an intruder at a very near distance of the monitored area. As a result, detailed information of an intruder can be obtained and reported to the user.

Additionally, since the video camera 671 is disposed in the vehicle 601, the possibility of an intruder realizing that he/she is monitored is smaller compared to the case in which the video camera 671 is disposed outside the vehicle 601, for example, on the roof the vehicle 601. Accordingly, the video camera 671 is hidden inside the vehicle 601, thereby preventing monitoring to be interfered with. This is very effective in monitoring not only households, but also, for example, stores.

In step S323, the microcomputer 676 turns OFF the power control relay 675 to stop supplying power to the video camera 671, the processor 672, and the wireless communication unit 673, thereby rendering these elements inoperable.

If settings in steps S321, S322, and S323 have already been made before the processing, these steps are ignored.

In step S324, the microcomputer 676 reads the distance information obtained by the distance sensor of the trigger sensor 682.

In step S325, the microcomputer 676 determines whether there is a change in the distance information read in step S324.

If it is found in step S325 that there is a change in the distance information, the process proceeds to step S326. In step S326, the microcomputer 676 turns ON the power control relay 675 to supply power to the video camera unit 671, the processor 672, and the wireless communication unit 673 from the battery unit 678, thereby operating these elements. Accordingly, the video camera unit 671, the processor 672, and the wireless communication unit 673 are not operated under normal conditions, and only when there is a change in the distance information, these elements are operated, thereby making it possible to suppress power consumption of the video camera unit 671, the processor 672, and the wireless communication unit 673, which consume relatively large power.

In step S327, the microcomputer 676 sends the video signal obtained by the video camera 671 and subjected to various types of signal processing by the processor 672 to the reception display device 613 via the wireless communication unit 673.

In step S328, the microcomputer 676 controls the drive unit 680 to rotate the pan tilter 642 in the direction of a moving object. Accordingly, the video camera 671 can constantly transmit the video signal of the moving object to the reception display device 613.

In step S329, the microcomputer 676 sends an alarm (for example, a combination of characters and sound "abnormal condition has been detected") to the reception display device 613 via the wireless communication unit 673.

If it is found in step S325 that there is no change in the read distance information, in step S330, the microcomputer 676 detects the remaining amount of the battery unit 678.

In step S331, the microcomputer 676 determines whether the remaining amount of the battery unit 678 is smaller than the first reference value stored in the built-in memory 677.

If the outcome of step S331 is yes, in step S332, the microcomputer 676 controls the selector 679 to select the power of the vehicle battery unit 702, thereby preventing the discontinuous supply of power and making it possible to perform monitoring over a long period of time.

If it is found in step S331 that the remaining amount of the battery unit 678 is greater than or equal to the first reference value, or after step S332, the process proceeds to step S333. In step S333, the microcomputer 676 determines whether the remaining amount of the vehicle battery unit 702 is smaller than the second reference value stored in the memory 677.

If the outcome of step S333 is yes, in step S334, the microcomputer 676 sends the battery remaining-amount information to the reception display device 613. Accordingly, the user can be always informed that the batteries are running out. This processing is effective not only in reporting the remaining amount of the battery unit 678 of the video camera 671, but also in reporting the remaining amount of the vehicle battery unit 702.

After step S329 or S334, or if it is found in step S333 that the remaining amount of the vehicle battery unit 702 is greater than or equal to the second reference value, the process returns to step S310 of FIG. 33, and step S310 and the subsequent steps are then repeated.

The above-described series of processings may be executed by hardware or software. If software is used, the processings are executed by a computer in which a corresponding software program is integrated into dedicated hardware. Alternatively, the corresponding software program is installed from a recording medium into a computer, for example, a general-purpose computer that is able to execute various functions by installing various programs. An example of the general-purpose computer is the personal computer 500 shown in FIG. 19.

Figure 28:
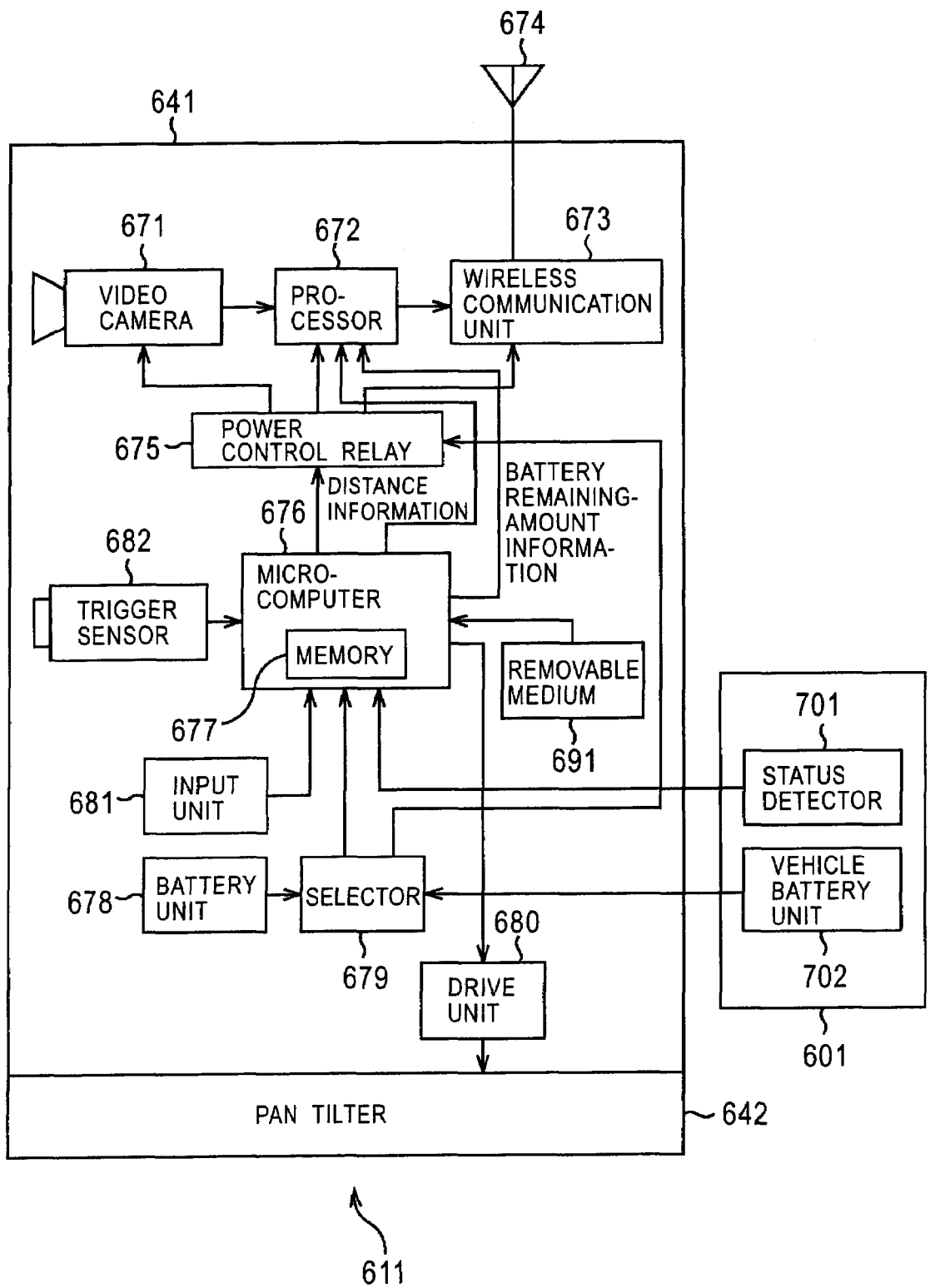
FIG. 28 is a block diagram illustrating the electrical configuration of the image-capturing device shown in FIG. 26.

The above-described recording medium includes not only a package medium formed of the removable medium 691, such as a magnetic disk, an optical disc, a magneto-optical disk, or a semiconductor memory, recording the program therein, as shown in FIG. 28, which is distributed to the user separately from the multi-sensor camera unit 641, but also the memory 677 recording the program therein, which is provided to the user by being integrated into the multi-sensor camera unit 641.

Steps of the computer program recorded in the recording medium may be performed in chronological order described in this embodiment, and also may be performed concurrently or individually.

According to this embodiment, vehicles can be safely reversed. Additionally, it is possible to monitor outside the vehicle when it is parked without making an intruder realize that he/she is monitored.

What is claimed is:

1. An object detection apparatus, comprising:
a first sensor configured to detect an object;
a second sensor configured to determine whether the object is coming close to or going away from the second sensor;
a third sensor including a video camera, a microphone, or a combination thereof;
power supply means for supplying power to the first sensor, the second sensor, and the third sensor; and
power supply control means for supplying power to the first sensor without supplying power to the second sensor, under a normal condition, in which the first sensor detects that the object is not present and for supplying power to the second sensor when the first sensor detects that the object is present,
wherein the power supply control means controls a power supply to the third sensor to be started when the second sensor has detected that the object is coming close to the second sensor, and controls the power supply to the third sensor to be prevented when the second sensor determines that the object is going away from the second sensor.

2. The object detection apparatus according to claim 1, wherein the first sensor consumes less power than the second sensor, and the second sensor consumes less power than the third sensor, when the power supply control means supplies the power to the first sensor, the second sensor, and the third sensor.

3. The object detection apparatus according to claim 1, wherein
the first sensor is an infrared sensor, and
the second sensor is a microwave sensor.

4. The object detection apparatus according to claim 1, further comprising:
transmission means for transmitting an output of the third sensor wirelessly.

5. The object detection apparatus according to claim 1, wherein,
when power is supplied to the third sensor after the second sensor has detected that the object is coming close to the second sensor, the power supply control means stops supplying power to the second sensor, and
when the first sensor no longer detects that the object is present, the power supply control means stops supplying power to the third sensor.

6. An object detection method, comprising:
detecting an object with a first sensor;
determining whether the object is coming close to or going away from a second sensor;
supplying power, by a power supply control unit, to the first sensor without supplying power to the second sensor, under a normal condition in which the first sensor detects that the object is not present;
supplying power, by the power supply control unit, to the second sensor, when the first sensor detects that the object is present;
starting a power supply, by the power supply control unit, to a third sensor, when the second sensor has detected that the object is coming close to the second sensor, the third sensor including a video camera, a microphone, or a combination thereof; and
preventing the power supply, by the power supply control unit, to the third sensor, when the second sensor determines that the object is going away from the second sensor.

7. The object detection method according to claim 6, wherein the first sensor consumes less power than the second sensor, and the second sensor consumes less power than the third sensor, when the first sensor, the second sensor, and the third sensor are supplied the power.

8. The object detection method according to claim 6, wherein,
the first sensor is an infrared sensor, and
the second sensor is a microwave sensor.

9. The object detection method according to claim 6, further comprising:
wirelessly transmitting an output of the third sensor.

10. The object detection method according to claim 6, further comprising:
stopping the power supply to the second sensor, when the power supply to the third sensor is started after the second sensor has detected that the object is coming close to the second sensor; and
stopping the power supply to the third sensor, when the first sensor no longer detects that the object is present.

11. A computer-readable medium encoded with computer executable instructions, wherein the instructions, when executed by a processor, cause the processor to perform a method, comprising:

detecting an object with a first sensor;

determining whether the object is coming close to or going away from a second sensor;

supplying power, by a power supply control unit, to the first sensor without supplying power to the second sensor, under a normal condition in which the first sensor detects that the objection is not present;

supplying power, by the power supply control unit, to the second sensor, when the first sensor detects that the object is present;

starting a power supply, by the power supply control unit, to a third sensor, when the second sensor has detected that the object is coming close to the second sensor, the third sensor including a video camera, a microphone, or a combination thereof; and preventing the power supply, by the power supply control unit, to the third sensor, when the second sensor determines that the object is going away from the second sensor.

12. The computer-readable medium according to claim 11, wherein the first sensor consumes less power than the second sensor, and the second sensor consumes less power than the third sensor, when the first sensor, the second sensor, and the third sensor are supplied the power.

13. The computer-readable medium according to claim 11, wherein, the first sensor is an infrared sensor, and the second sensor is a microwave sensor.

14. The computer-readable medium according to claim 11, the method further comprising:

wirelessly transmitting an output of the third sensor.

15. The computer-readable medium according to claim 11, the method further comprising:

stopping the power supply to the second sensor, when the power supply to the third sensor is started after the second sensor has detected that the object is coming close to the second sensor; and stopping the power supply to the third sensor, when the first sensor no longer detects that the object is present.

16. An object detection apparatus, comprising:

a first sensor configured to detect an object;

a second sensor configured to determine whether the object is coming close to or going away from the second sensor;

a third sensor including a video camera, a microphone, or a combination thereof;

a power supply unit configured to supply power to the first sensor, the second sensor, and the third sensor; and a power supply control unit configured to supply power to the first sensor without supplying power to the second sensor under a normal condition in which the first sensor detects that the object is not present, to supply power to the second sensor when the first sensor detects that the object is present, to control a power supply to the third sensor to be started when the second sensor has detected that the object is coming close to the second sensor, and to control the power supply to the third sensor to be prevented when the second sensor determines that the object is going away from the second sensor.

17. The object detection apparatus according to claim 16, wherein the first sensor consumes less power than the second sensor, and the second sensor consumes less power than the third sensor, when the power supply unit supplies the power to the first sensor, the second sensor, and the third sensor.

18. The object detection apparatus according to claim 16, wherein, the first sensor is an infrared sensor, and the second sensor is a microwave sensor.

19. The object detection apparatus according to claim 16, further comprising:

a transmission unit configured to transmit an output of the third sensor wirelessly.

20. The object detection apparatus according to claim 16, wherein, the power supply control unit is configured to stop supplying power to the second sensor, when power is supplied to the third sensor after the second sensor has detected that the object is coming close to the second sensor, and the power supply control unit is configured to stop supplying power to the third sensor, when the first sensor no longer detects that the object is present.

* * * * *